US012575088B2

(12) United States Patent
Chang

(10) Patent No.: US 12,575,088 B2
(45) Date of Patent: Mar. 10, 2026

(54) MEMORY DEVICE HAVING WORD LINE SURROUNDING GATE STRUCTURE AND MANUFACTURING METHOD THEREOF

(71) Applicant: NANYA TECHNOLOGY CORPORATION, New Taipei City (TW)

(72) Inventor: Szu-Yao Chang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 850 days.

(21) Appl. No.: 17/862,527

(22) Filed: Jul. 12, 2022

(65) Prior Publication Data

US 2024/0023321 A1     Jan. 18, 2024

(51) Int. Cl.
H10B 12/00          (2023.01)
(52) U.S. Cl.
CPC ......... H10B 12/488 (2023.02); H10B 12/033 (2023.02); H10B 12/0383 (2023.02)
(58) Field of Classification Search
CPC ........ G11C 11/34; H10B 12/30; H10B 12/34; H10B 12/395; H10B 12/373
See application file for complete search history.

(56) References Cited

U.S. PATENT DOCUMENTS

| | | | |
|---|---|---|---|
| 2014/0024214 A1 | 1/2014 | Kim et al. | |
| 2020/0381557 A1* | 12/2020 | Hattori | H10D 30/6755 |
| 2020/0411528 A1* | 12/2020 | Sung | H10B 12/05 |
| 2022/0013524 A1 | 1/2022 | Ryu et al. | |
| 2022/0139916 A1 | 5/2022 | Kwak | |

FOREIGN PATENT DOCUMENTS

TW          I763567 B     5/2022

OTHER PUBLICATIONS

Office Action and and the search report mailed on Nov. 23, 2023 related to Taiwanese Application No. 111148497.

* cited by examiner

*Primary Examiner* — Brent A. Fairbanks
*Assistant Examiner* — Timothy K Schow
(74) *Attorney, Agent, or Firm* — Xuan Zhang

(57)          ABSTRACT

The present application provides a memory device having a word line (WL) surrounding a gate structure and a manufacturing method of the memory device. The memory device includes a first dielectric surrounding a capacitor; a second dielectric disposed over the first dielectric and the capacitor; a word line embedded in the second dielectric; and a gate structure disposed over the capacitor and extending through the second dielectric, wherein the gate structure is at least partially surrounded by the word line.

13 Claims, 24 Drawing Sheets

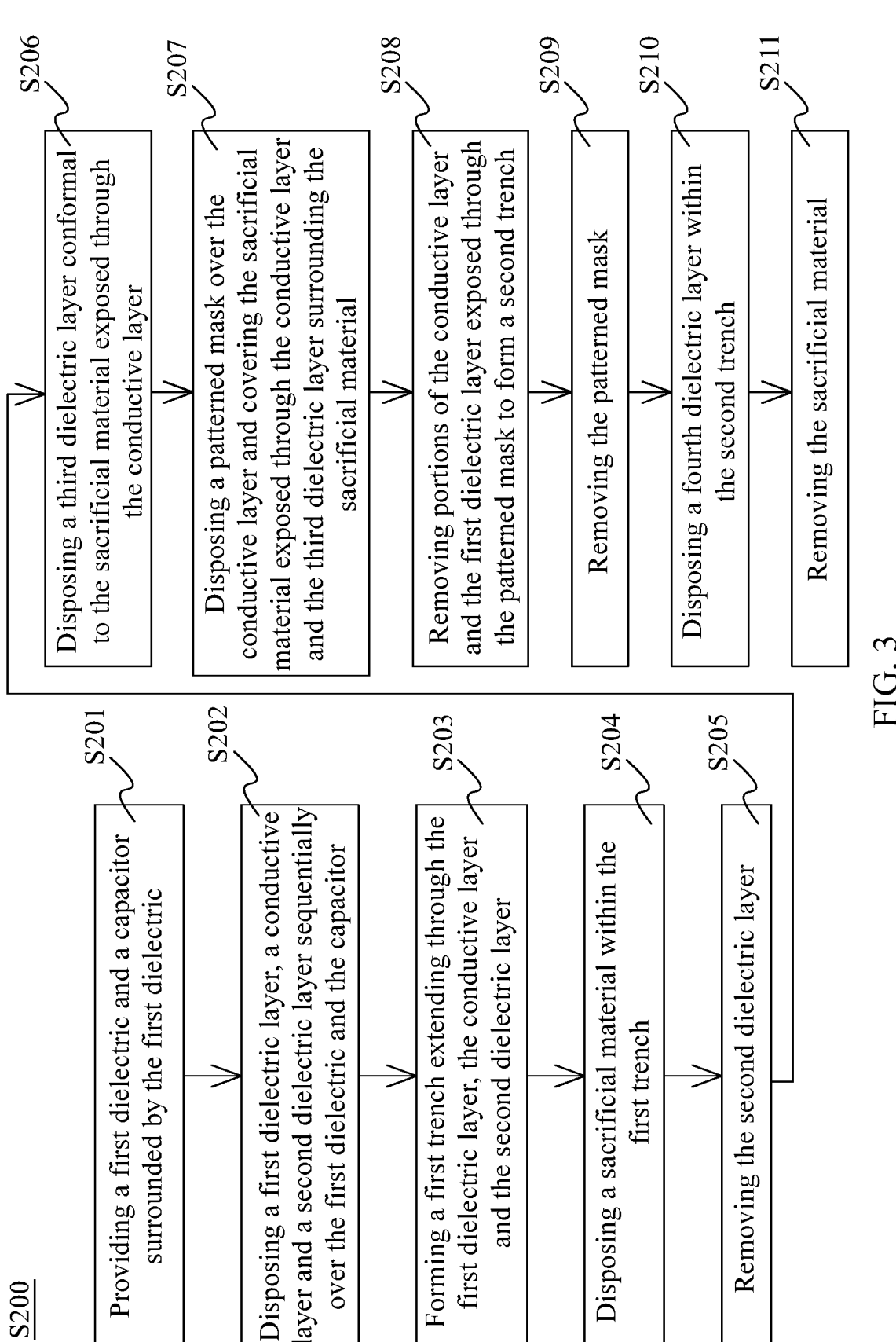

S200

S201 — Providing a first dielectric and a capacitor surrounded by the first dielectric S202 — Disposing a first dielectric layer, a conductive layer and a second dielectric layer sequentially over the first dielectric and the capacitor S203 — Forming a first trench extending through the first dielectric layer, the conductive layer and the second dielectric layer S204 — Disposing a sacrificial material within the first trench S205 — Removing the second dielectric layer S206 — Disposing a third dielectric layer conformal to the sacrificial material exposed through the conductive layer S207 — Disposing a patterned mask over the conductive layer and covering the sacrificial material exposed through the conductive layer and the third dielectric layer surrounding the sacrificial material S208 — Removing portions of the conductive layer and the first dielectric layer exposed through the patterned mask to form a second trench S209 — Removing the patterned mask S210 — Disposing a fourth dielectric layer within the second trench S211 — Removing the sacrificial material

FIG. 3

MEMORY DEVICE HAVING WORD LINE SURROUNDING GATE STRUCTURE AND MANUFACTURING METHOD THEREOF

TECHNICAL FIELD

The present disclosure relates to a memory device and a manufacturing method thereof, and more particularly, to a memory device having a word line (WL) surrounding a gate structure and a manufacturing method of the memory device.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) surrounded by a shallow trench isolation (STI) structure.

Over the past few decades, as semiconductor fabrication technology has continuously improved, sizes of electronic devices have been correspondingly reduced. As a size of a cell transistor is reduced to a few nanometers in length, overlay shift may occur. The overlay shift may result in misalignment and significantly reduce performance of the cell transistors. It is therefore desirable to develop improvements that address related manufacturing challenges.

SUMMARY

One aspect of the present disclosure provides a memory device. The memory device includes a first dielectric surrounding a capacitor; a second dielectric disposed over the first dielectric and the capacitor; a word line embedded in the second dielectric; and a gate structure disposed over the capacitor and extending through the second dielectric, wherein the gate structure is at least partially surrounded by the word line.

In some embodiments, a portion of the second dielectric extends through and is surrounded by the word line.

In some embodiments, the portion of the second dielectric is separated from the gate structure.

In some embodiments, a shortest distance between the gate structure and the portion of the second dielectric is in a range of about 3 nm to about 8 nm.

In some embodiments, the word line includes tungsten (W).

In some embodiments, the gate structure includes a gate dielectric and a gate electrode surrounded by the gate dielectric.

In some embodiments, the gate electrode is electrically connected to the capacitor.

In some embodiments, the word line is in contact with the gate dielectric.

In some embodiments, the gate dielectric includes silicon oxide, and the gate electrode includes indium gallium zinc oxide (IGZO).

In some embodiments, a thickness of the first dielectric is substantially greater than a thickness of the second dielectric.

In some embodiments, the thickness of the second dielectric is in a range of about 90 nm to about 110 nm.

In some embodiments, the capacitor includes a first conductive member and a second conductive member disposed over the first conductive member.

In some embodiments, the second conductive member is in contact with the gate structure.

In some embodiments, the first conductive member includes silicon, and the second conductive member includes indium tin oxide (ITO).

In some embodiments, a width of the gate structure is in a range of about 20 nm to about 30 nm.

Another aspect of the present disclosure provides a memory device. The memory device includes a first dielectric surrounding a capacitor; a second dielectric disposed over the first dielectric and the capacitor; a word line embedded in the second dielectric; and a gate structure disposed over the capacitor and surrounded by the second dielectric and the word line, wherein at least a portion of the gate structure is enclosed by the word line.

In some embodiments, the gate structure is substantially orthogonal to the word line.

In some embodiments, the gate structure is vertically aligned with the capacitor.

In some embodiments, the capacitor is surrounded by a dielectric liner, wherein the dielectric liner includes oxide and nitride.

In some embodiments, a width of the capacitor is substantially greater than a width of the gate structure.

Another aspect of the present disclosure provides a method of manufacturing a memory device. The method includes steps of providing a first dielectric and a capacitor surrounded by the first dielectric; disposing a first dielectric layer, a conductive layer and a second dielectric layer sequentially over the first dielectric and the capacitor; forming a first trench extending through the second dielectric layer, the conductive layer and the first dielectric layer; disposing a sacrificial material within the first trench; removing the second dielectric layer; disposing a third dielectric layer conformal to the sacrificial material exposed through the conductive layer; disposing a patterned mask over the conductive layer and over the sacrificial material exposed through the conductive layer and over the third dielectric layer surrounding the sacrificial material; removing portions of the conductive layer and the first dielectric layer exposed through the patterned mask to form a second trench; removing the patterned mask; disposing a fourth dielectric layer within the second trench; and removing the sacrificial material.

In some embodiments, the sacrificial material includes amorphous silicon (a-Si) or polysilicon.

In some embodiments, the sacrificial material is disposed at a temperature substantially less than 400° C.

In some embodiments, the first dielectric layer, the third dielectric layer and the fourth dielectric layer are integrated to form a second dielectric.

In some embodiments, a third trench extending through the second dielectric and at least partially surrounded by the conductive layer is formed after the removal of the sacrificial material.

In some embodiments, the method further comprises forming a gate structure within the third trench.

In some embodiments, the formation of the gate structure includes disposing a gate dielectric conformal to the third trench, and disposing a gate electrode over the capacitor.

In some embodiments, the gate electrode is surrounded by the gate dielectric.

In some embodiments, the sacrificial material is removed by wet etching.

In some embodiments, the sacrificial material is in contact with the first dielectric layer, the conductive layer and the third dielectric layer.

In some embodiments, after the formation of the second trench, at least a portion of the sacrificial material is enclosed by the conductive layer.

In some embodiments, at least a portion of the fourth dielectric layer is surrounded by the first dielectric layer.

In some embodiments, the sacrificial material is disposed over the capacitor.

In some embodiments, the first trench exposes at least a portion of the capacitor.

In some embodiments, the patterned mask includes carbon or nitride.

In conclusion, because a sacrificial material is disposed at a position of a gate structure to be subsequently formed, such advance position definition can prevent overlay shift of the gate structure. More specifically, because the sacrificial material is subsequently replaced by the gate structure, the gate structure surrounded by a word line can be readily formed, and such replacement can prevent incomplete enclosure of the gate structure by the word line. Therefore, performance of the memory device and a process of manufacturing the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3 is a flow diagram illustrating a method of manufacturing a memory device in accordance with some embodiments of the present disclosure.

DETAILED DESCRIPTION

Figure 1:
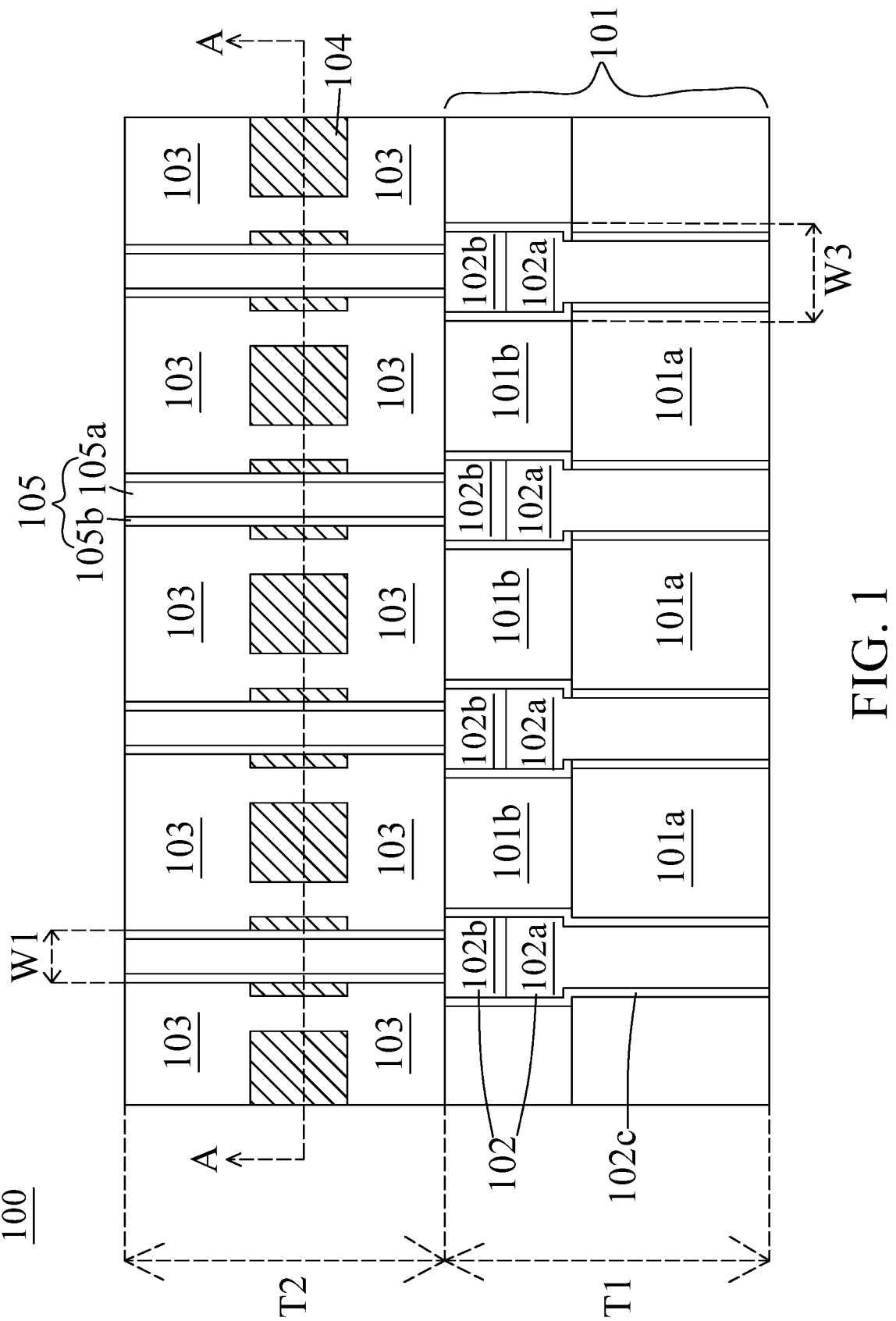
FIG. 1 is a cross-sectional side view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
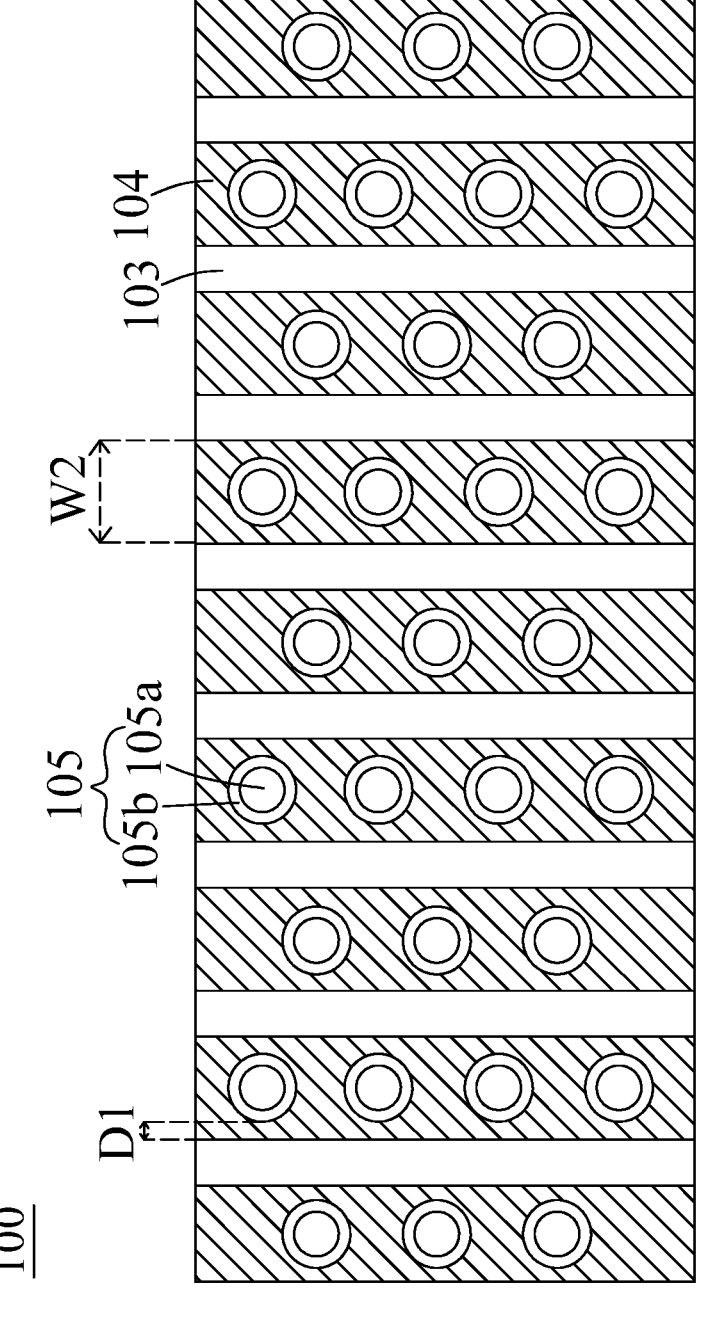
FIG. 2 is a cross-sectional top view of the memory device of FIG. 1 along a line A-A.

FIG. 1 is a schematic cross-sectional side view of a memory device 100 in accordance with some embodiments of the present disclosure. FIG. 2 is a schematic cross-sectional top view of the memory device 100 of FIG. 1 along a line A-A. In some embodiments, the memory device 100 includes several unit cells arranged in rows and columns.

In some embodiments, the memory device 100 includes a first dielectric 101 surrounding a capacitor 102. In some embodiments, the first dielectric 101 includes several dielectric layers stacked over each other. In some embodiments, the first dielectric 101 is formed of a dielectric material, such as silicon oxide, silicon nitride, silicon oxynitride, the like, or a combination thereof.

In some embodiments, the first dielectric 101 includes a first insulating layer 101a and a second insulating layer 101b disposed over the first insulating layer 101a. In some embodiments, the first insulating layer 101a includes oxide, and the second insulating layer 101b includes nitride. In some embodiments, the first insulating layer 101a and the second insulating layer 101b are formed of a dielectric material, such as silicon oxide, silicon nitride, silicon oxynitride, the like, or a combination thereof. In some embodiments, a thickness of the first insulating layer 101a is substantially greater than a thickness of the second insulating layer 101b.

In some embodiments, the capacitor 102 includes a first conductive member 102a and a second conductive member 102b. In some embodiments, the first conductive member 102a extends through the first insulating layer 101a and partially through the second insulating layer 101b. In some embodiments, the first conductive member 102a is surrounded by a dielectric liner 102c. In some embodiments, the first conductive member 102a includes conductive or semiconductive material such as silicon. In some embodiments, a cross section of the capacitor 102 is in a circular shape.

In some embodiments, the second conductive member 102b is disposed over the first conductive member 102a. In some embodiments, the second conductive member 102b extends partially through the second insulating layer 101b. In some embodiments, the second conductive member 102b is surrounded by the dielectric liner 102c. In some embodiments, the second conductive member 102b includes conductive material such as indium tin oxide (ITO) or the like.

In some embodiments, the second conductive member 102b is a drain region of a substrate disposed under the first dielectric 101.

In some embodiments, the dielectric liner 102c extends through the first dielectric 101 and surrounds the first conductive member 102a and the second conductive member 102b. In some embodiments, the dielectric liner 102c is formed of a dielectric material, such as silicon oxide, silicon nitride, silicon oxynitride, the like, or a combination thereof. In some embodiments, the dielectric liner 102c includes several layers respectively extending through the first dielectric 101. In some embodiments, the dielectric liner 102c is a nitride-oxide-nitride (NON) structure surrounding the first conductive member 102a and the second conductive member 102b.

In some embodiments, the memory device 100 includes a second dielectric 103 disposed over the first dielectric 101 and the capacitor 102. In some embodiments, the second dielectric 103 includes several dielectric layers stacked over each other. In some embodiments, the second dielectric 103 is formed of a dielectric material, such as silicon oxide, silicon nitride, silicon oxynitride, the like, or a combination thereof.

In some embodiments, the second dielectric 103 includes several oxide layers stacked over each other. In some embodiments, the first dielectric 101 and the second dielectric 103 include same or different materials. In some embodiments, a thickness T1 of the first dielectric 101 is substantially greater than a thickness T2 of the second dielectric 103. In some embodiments, the thickness T2 of the second dielectric 103 is in a range of about 90 nm to about 110 nm. In some embodiments, the thickness T2 is about 100 nm.

In some embodiments, the memory device 100 includes a word line 104 embedded in the second dielectric 103. In some embodiments, the word line 104 extends partially within the second dielectric 103. In some embodiments, the word line 104 extends horizontally over the first dielectric 101 and within the second dielectric 103. In some embodiments, a portion of the second dielectric 103 extends through and is surrounded by the word line 104. In some embodiments, the word line 104 includes conductive material such as tungsten (W) or the like. In some embodiments, a width W2 of the word line 104 is in a range of about 30 nm to about 40 nm.

In some embodiments, the memory device 100 includes a gate structure 105 disposed over the capacitor 102 and extending through the second dielectric 103. In some embodiments, the gate structure 105 is surrounded by the second dielectric 103 and the word line 104. The gate structure 105 is at least partially surrounded by the word line 104. At least a portion of the gate structure 105 is enclosed by the word line 104.

In some embodiments, the gate structure 105 is disposed over the capacitor 102. In some embodiments, the gate structure 105 is vertically aligned with the capacitor 102. In some embodiments, the gate structure 105 is in contact with the second conductive member 102b of the capacitor 102. In some embodiments, the gate structure 105 is substantially orthogonal to the word line 104. In some embodiments, a width W1 of the gate structure 105 is in a range of about 20 nm to about 30 nm. In some embodiments, the width W1 is about 25 nm.

In some embodiments, a portion of the second dielectric 103 is separated from the gate structure 105. In some embodiments, a shortest distance D1 between the gate structure 105 and the portion of the second dielectric 103 is in a range of about 3 nm to about 8 nm. In some embodiments, the shortest distance D1 is in a range of about 5 nm to about 7 nm. In some embodiments, a width W3 of the capacitor 102 is substantially greater than the width W1 of the gate structure 105. In some embodiments, a cross section of the gate structure 105 is in a circular shape.

In some embodiments, the gate structure 105 includes a gate dielectric 105b and a gate electrode 105a surrounded by the gate dielectric 105b. In some embodiments, the gate electrode 105a is electrically connected to the capacitor 102. The gate electrode 105a is in contact with the second conductive member 102b. In some embodiments, the gate electrode 105a includes conductive material such as indium gallium zinc oxide (IGZO) or the like.

In some embodiments, the gate dielectric 105b encloses the gate electrode 105a. In some embodiments, the word line 104 is in contact with the gate dielectric 105b. In some embodiments, the gate dielectric 105b includes dielectric material such as silicon oxide or the like. Since each of the gate structures 105 is surrounded by the word line 104, incomplete enclosure of the gate structure 105 by the word line 104 is prevented. Therefore, performance of the memory device 100 is improved.

FIG. 3 is a flow diagram illustrating a method S200 of manufacturing a memory device 100 in accordance with some embodiments of the present disclosure, and FIGS. 4 to 24 illustrate cross-sectional views of intermediate stages in formation of the memory device 100 in accordance with some embodiments of the present disclosure.

The stages shown in FIGS. 4 to 24 are also illustrated schematically in the flow diagram in FIG. 3. In following discussion, the fabrication stages shown in FIGS. 4 to 24 are discussed in reference to process steps shown in FIG. 3. The method S200 includes a number of operations, and description and illustration are not deemed as a limitation to a sequence of the operations. The method S200 includes a number of steps (S201, S202, S203, S204, S205, S206, S207, S208, S209, S210 and S211).

Figure 4:
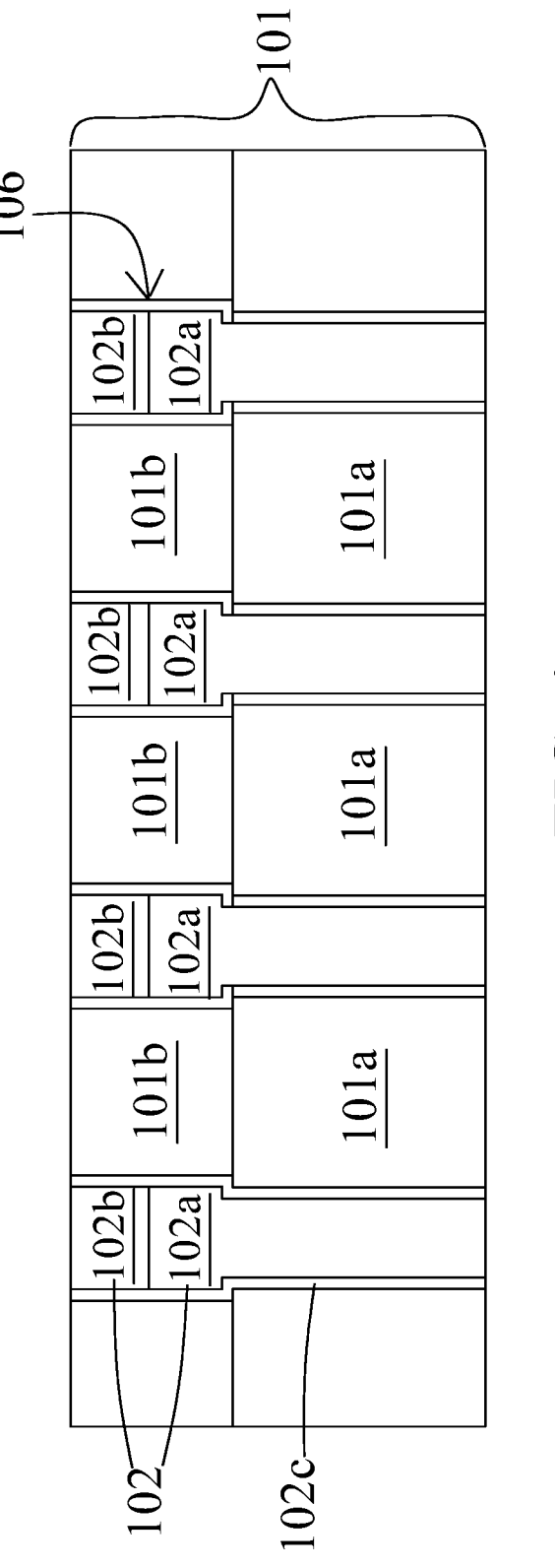
FIGS. 4 to 24 illustrate cross-sectional views of intermediate stages in the formation of a memory device in accordance with some embodiments of the present disclosure.

Referring to FIG. 4, a first dielectric 101 and a capacitor 102 are provided according to step S201 in FIG. 3. In some embodiments, the capacitor 102 is surrounded by the first dielectric 101. In some embodiments, the first dielectric 101 is formed by disposing a first insulating layer 101a and disposing a second insulating layer 101b over the first insulating layer 101a.

In some embodiments, the first insulating layer 101a and the second insulating layer 101b are disposed by deposition, oxidation or any other suitable process. In some embodiments, the disposing of the first insulating layer 101a includes disposing dielectric material such as oxide or the like, and the disposing of the second insulating layer 101b includes disposing dielectric material such as nitride or the like.

In some embodiments, some portions of the first insulating layer 101a and the second insulating layer 101b are removed to form a first opening 106 before a formation of the capacitor 102 surrounded by the first dielectric 101. The capacitor 102 is formed within the first opening 106. In some embodiments, the formation of the capacitor 102 includes disposing a dielectric liner 102c conformal to the first opening 106, forming a first conductive member 102a within the first opening 106 and surrounded by the dielectric liner 102c, and forming a second conductive member 102b over the first conductive member 102a.

In some embodiments, after the formation of the first opening 106, the dielectric liner 102c is disposed along a sidewall of the first opening 106. In some embodiments, the dielectric liner 102c is disposed by deposition or any other suitable process. In some embodiments, the dielectric liner 102c includes oxide and nitride.

In some embodiments, after the disposing of the dielectric liner 102c, the first conductive member 102a is formed by disposing conductive or semiconductive material such as silicon or the like within the first opening 106 and surrounded by the dielectric liner 102c. In some embodiments, the first conductive member 102a is formed by deposition, chemical vapor deposition (CVD) or any other suitable process.

In some embodiments, after the formation of the first conductive member 102a, the second conductive member 102b is formed by disposing conductive material such as ITO or the like over the first conductive member 102a and within the first opening 106 and surrounded by the dielectric liner 102c. In some embodiments, the second conductive member 102b is formed by deposition, CVD or any other suitable process.

Figure 5:
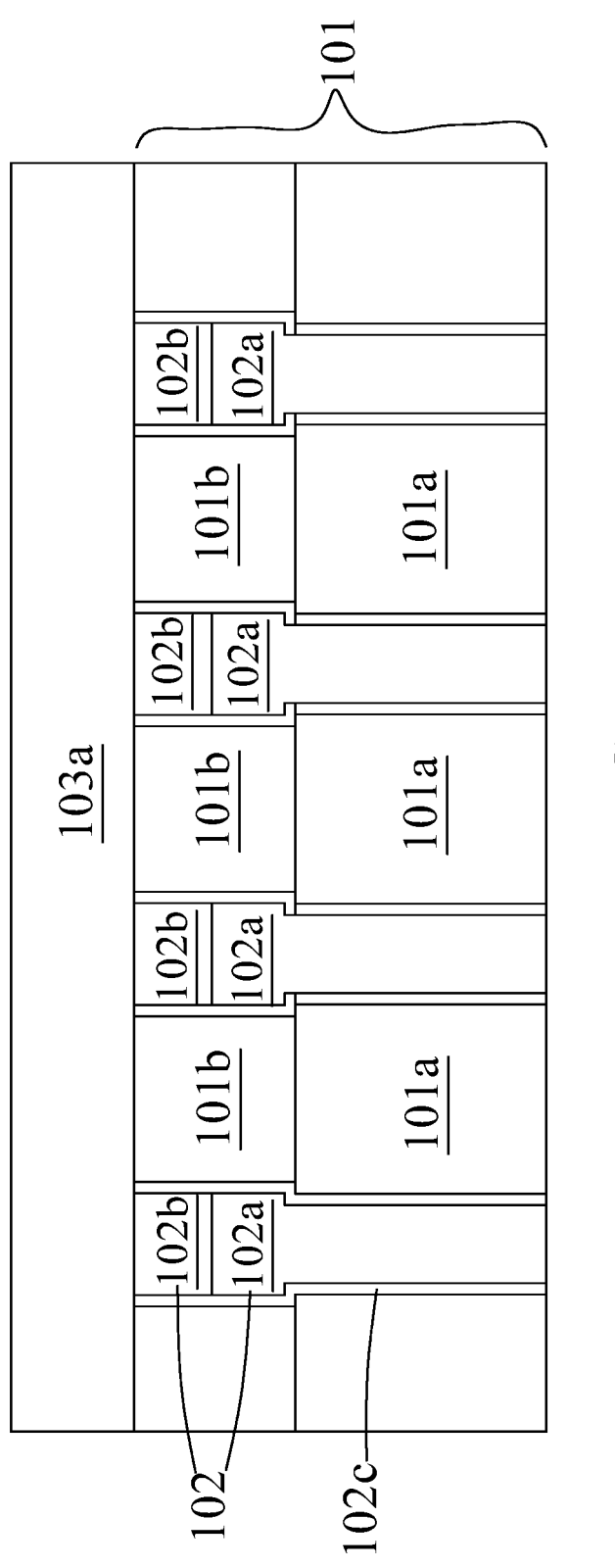
Figure 6:
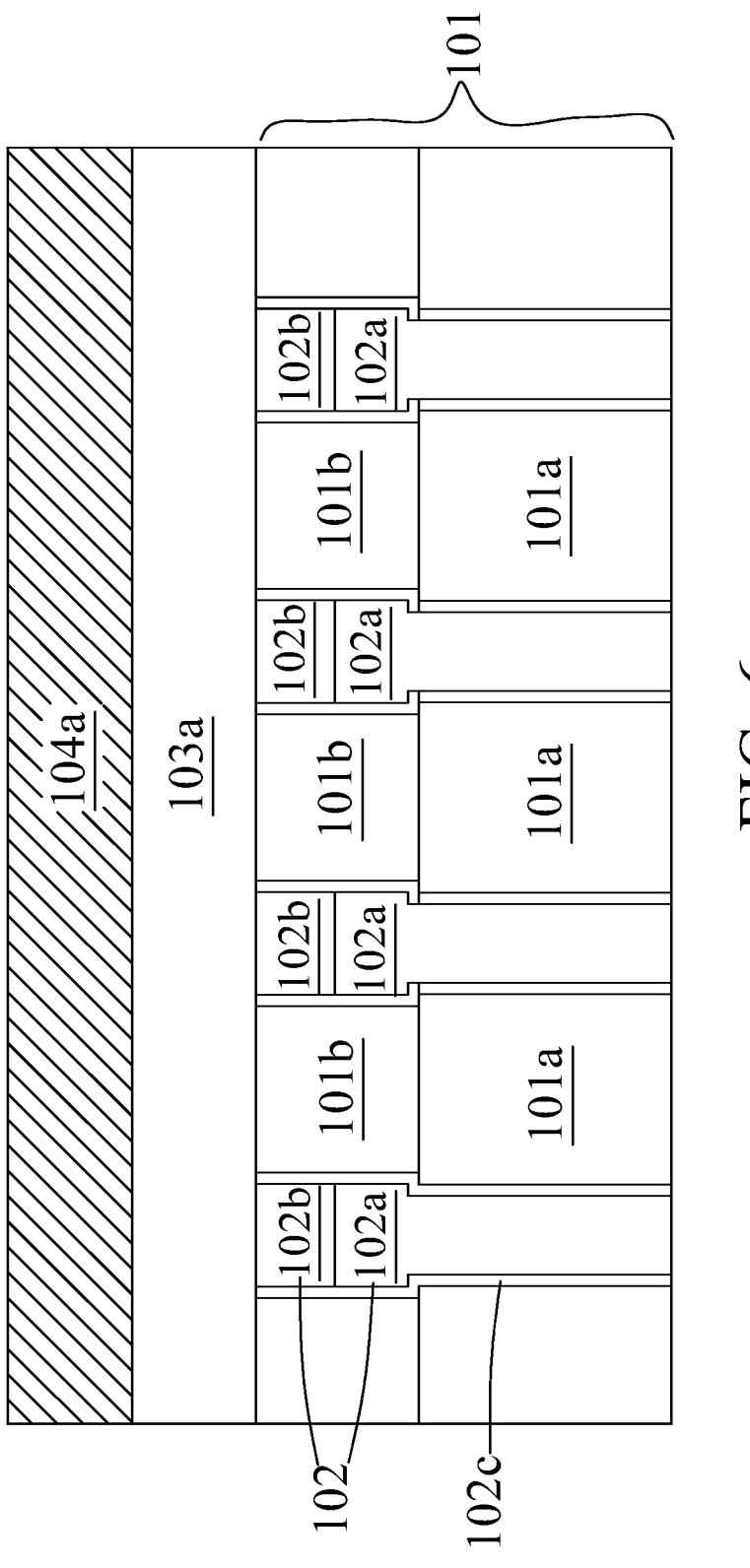
Figure 7:
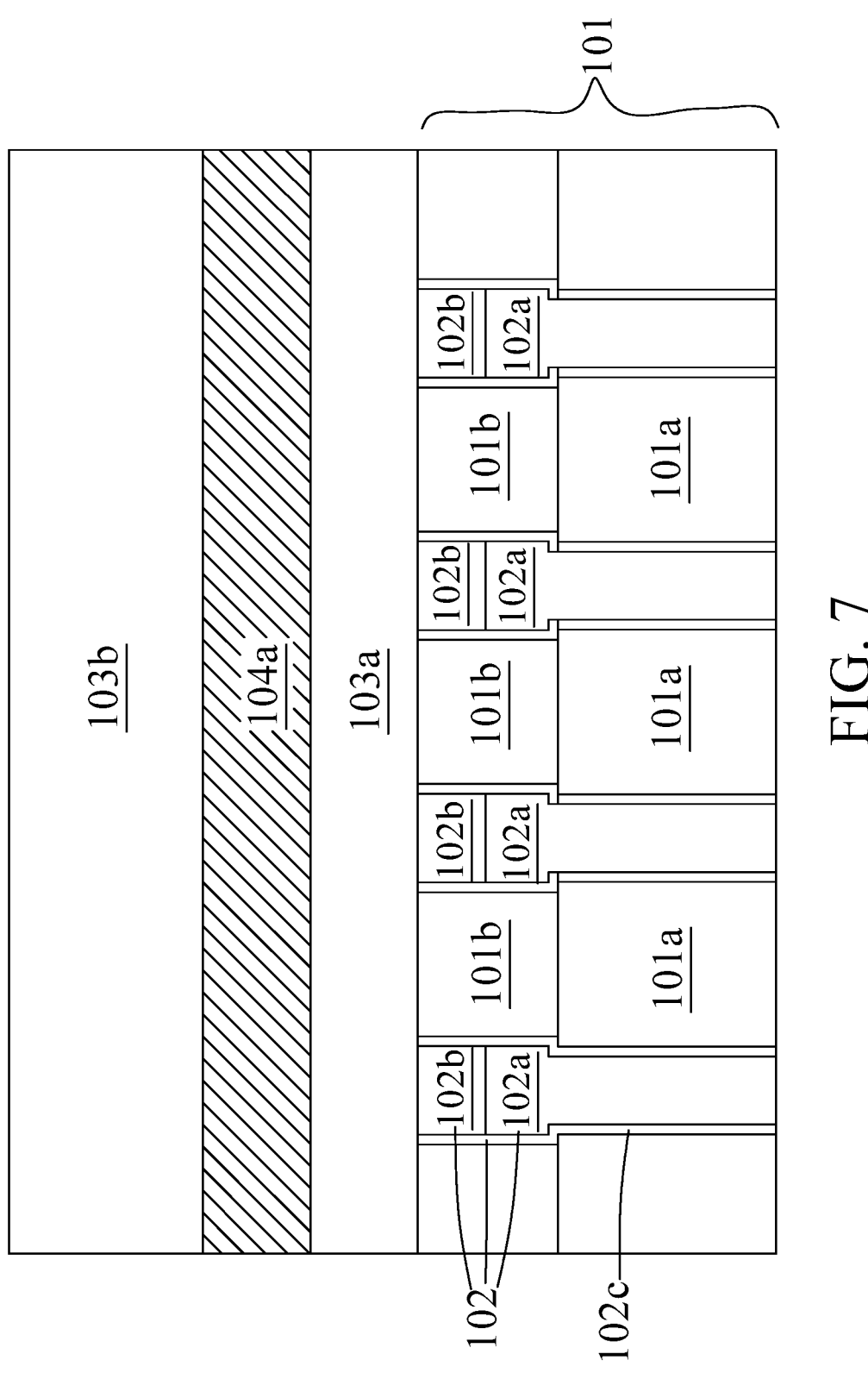

Referring to FIGS. 5 to 7, a first dielectric layer 103a, a conductive layer 104a and a second dielectric layer 103b are sequentially disposed over the first dielectric 101 and the capacitor 102 according to step S202 in FIG. 3. In some embodiments as shown in FIG. 5, the first dielectric layer 103a is disposed over the first dielectric 101 and the capacitor 102. In some embodiments, the first dielectric layer 103a is disposed by deposition, oxidation or any other suitable process. In some embodiments, a thickness of the first dielectric layer 103a is about 30 nm. In some embodiments, the first dielectric layer 103a is formed by disposing a dielectric material such as oxide or the like over the first dielectric 101 and the capacitor 102.

After the disposing of the first dielectric layer 103a as shown in FIG. 5, the conductive layer 104a is disposed over the first dielectric layer 103a as shown in FIG. 6. In some embodiments, the conductive layer 104a is disposed by deposition, CVD or any other suitable process. In some embodiments, the conductive layer 104a is formed by disposing a conductive material such as tungsten or the like over the first dielectric layer 103a. In some embodiments, a thickness of the conductive layer 104a is about 45 nm.

After the disposing of the conductive layer 104a as shown in FIG. 6, the second dielectric layer 103b is disposed over the conductive layer 104a as shown in FIG. 7. In some embodiments, the second dielectric layer 103b is disposed by deposition, oxidation or any other suitable process. In some embodiments, a thickness of the second dielectric layer 103b is substantially greater than the thickness of the first dielectric layer 103a. In some embodiments, the thickness of the second dielectric layer 103b is about 60 nm. In some embodiments, the second dielectric layer 103b is formed by disposing a dielectric material such as oxide or the like over the conductive layer 104a.

Figure 8:
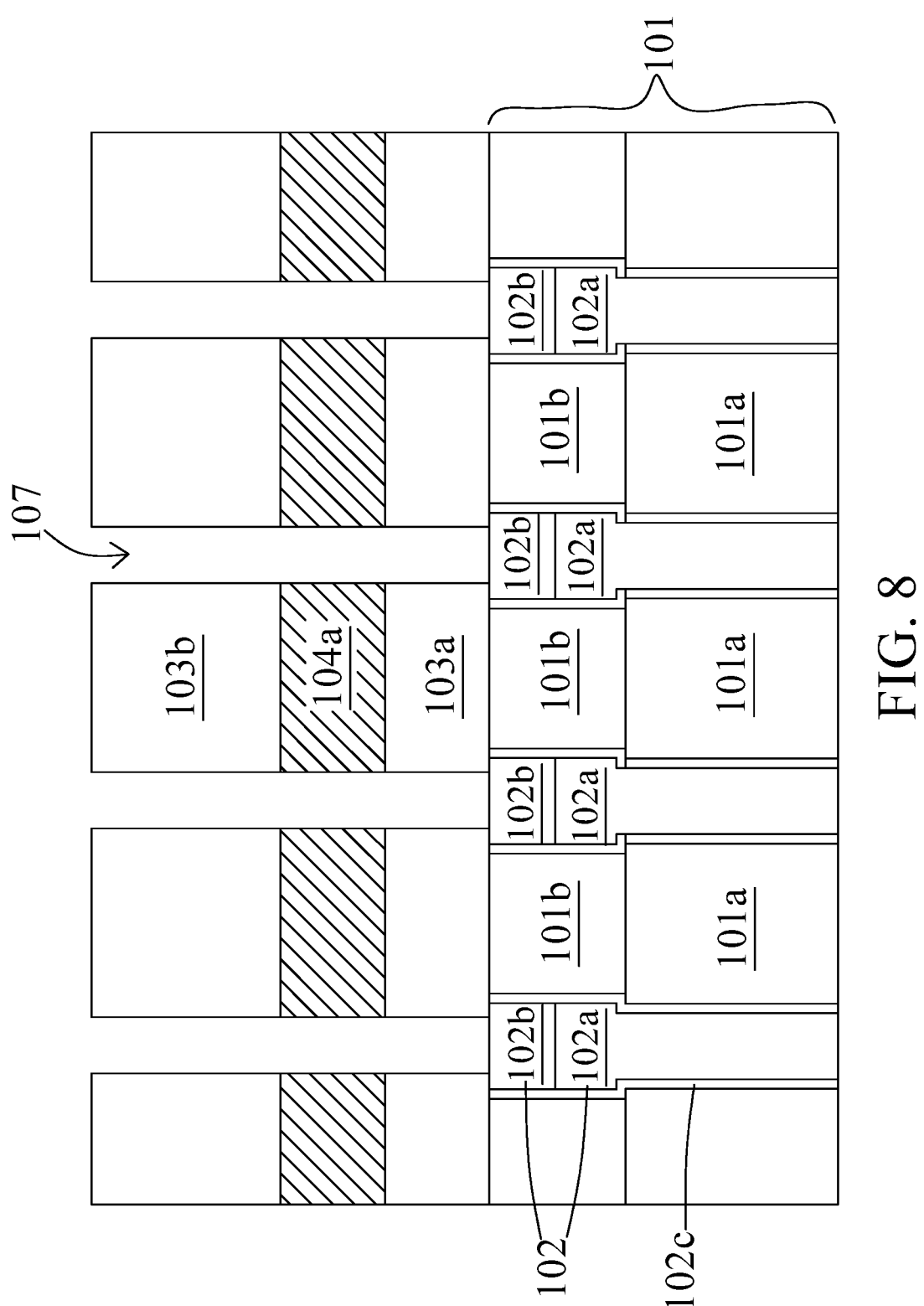

Referring to FIG. 8, a first trench 107 extending through the second dielectric layer 103b, the conductive layer 104a and the first dielectric layer 103a is formed according to step S203 in FIG. 3. In some embodiments, some portions of the second dielectric layer 103b, the conductive layer 104a and the first dielectric layer 103a are removed by etching or any other suitable process to form the first trench 107. In some embodiments, the first trench 107 exposes at least a portion of the capacitor 102 or a portion of the second conductive member 102b. In some embodiments, the first trench 107 is disposed over and vertically aligned with the capacitor 102.

Figure 9:
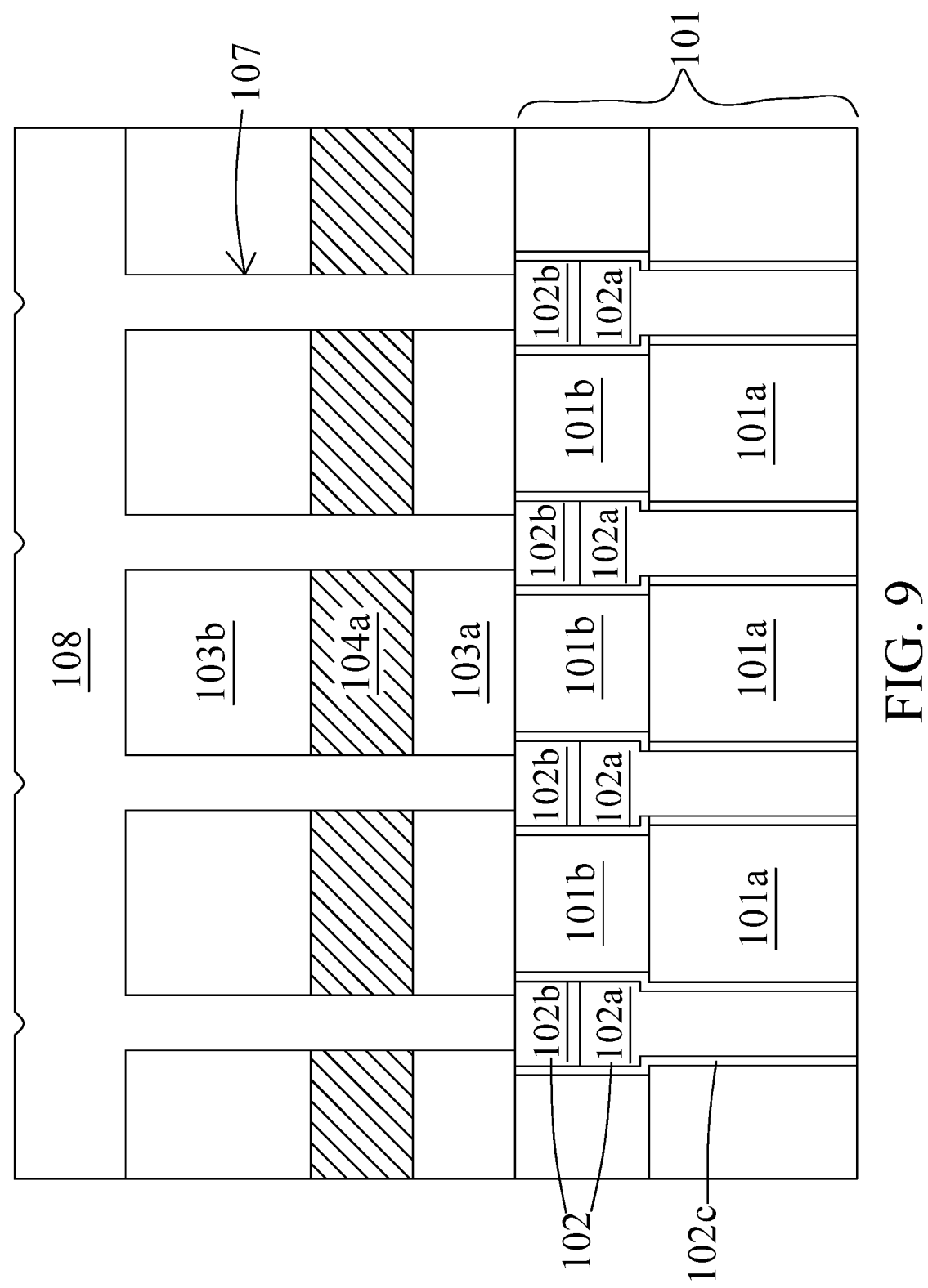

Referring to FIG. 9, a sacrificial material 108 is disposed within the first trench 107 according to step S204 in FIG. 3. In some embodiments, the sacrificial material 108 is disposed over the second dielectric layer 103b and within the first trench 107. In some embodiments, the sacrificial material 108 is disposed over the capacitor 102. In some embodiments, the sacrificial material 108 is in contact with the portion of the second conductive member 102b exposed through the first dielectric layer 103a. In some embodiments, the sacrificial material 108 is in contact with the first dielectric layer 103a, the conductive layer 104a and the second dielectric layer 103b. In some embodiments, a top surface of the sacrificial material 108 has a notch indented into the sacrificial material 108 and toward the capacitor 102. In some embodiments, the notch is vertically aligned with the first trench 107.

In some embodiments, the sacrificial material 108 is disposed by deposition or any other suitable process. In some embodiments, the sacrificial material 108 includes amorphous silicon (a-Si), polysilicon, doped polysilicon or the like. In some embodiments, the sacrificial material 108 is disposed at a temperature substantially less than 400° C.

Figure 10:
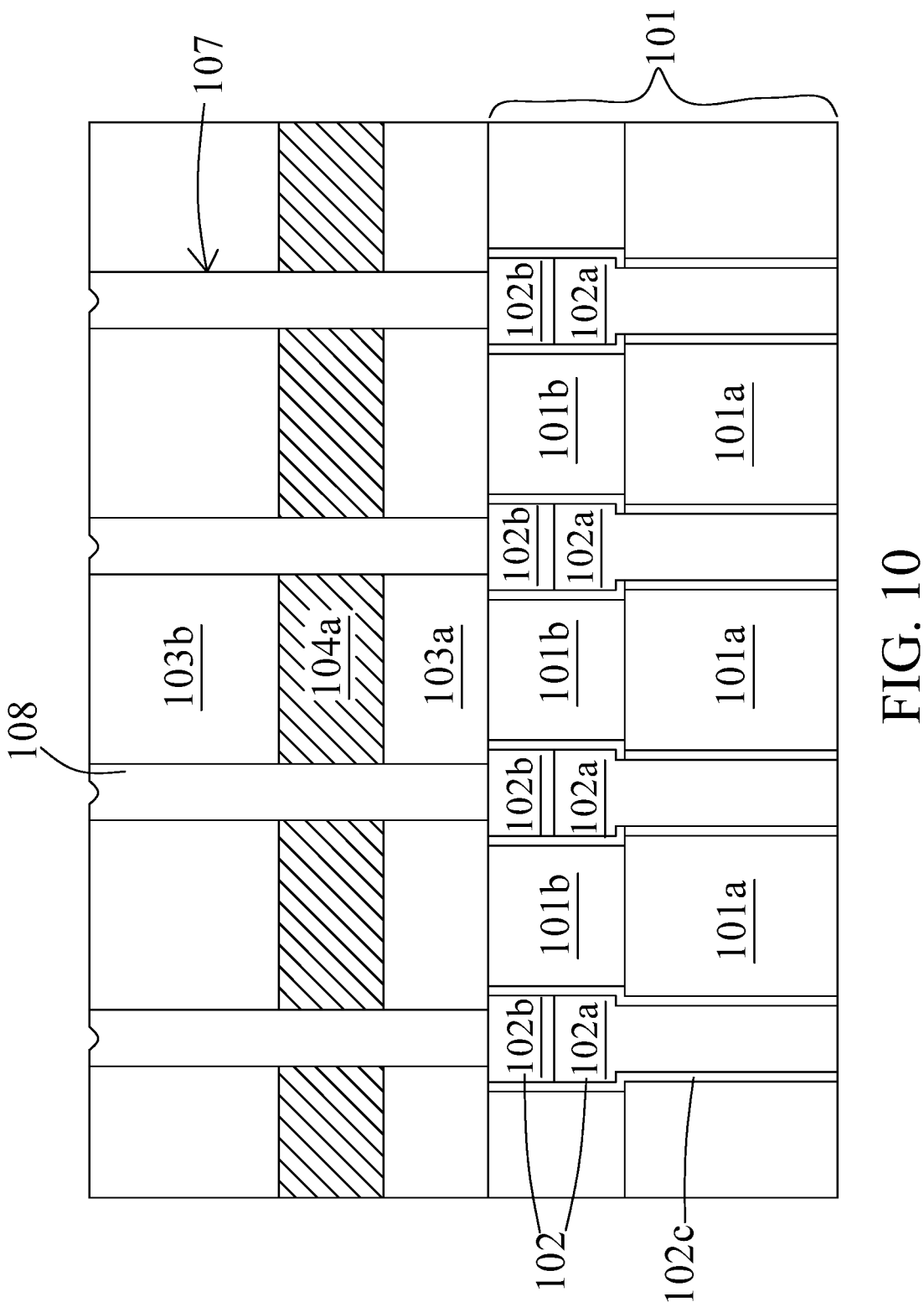

In some embodiments, after the disposing of the sacrificial material 108 as shown in FIG. 9, some portions of the sacrificial material 108 disposed over the second dielectric layer 103b are removed as shown in FIG. 10. In some embodiments, the portions of the sacrificial material 108 are removed by etching or any other suitable process. In some embodiments, the notch is now disposed at an upper end of the sacrificial material as shown in FIG. 10.

Figure 11:
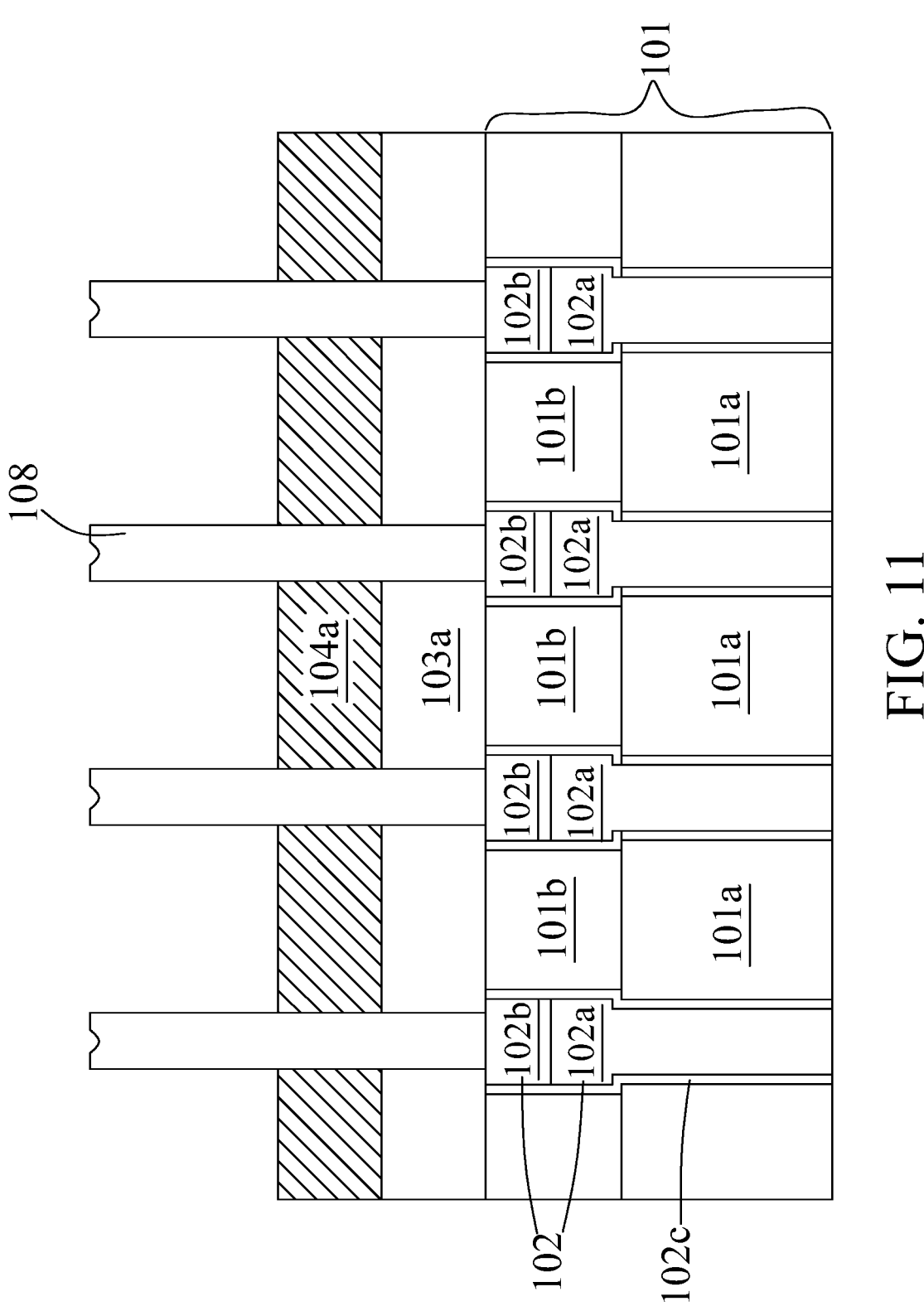

Referring to FIG. 11, the second dielectric layer 103b is removed according to step S205 in FIG. 3. In some embodiments, the second dielectric layer 103b is removed by wet etching or any other suitable process. In some embodiments, the sacrificial material 108 protrudes from the conductive layer 104a after the removal of the second dielectric layer 103b.

Figure 12:
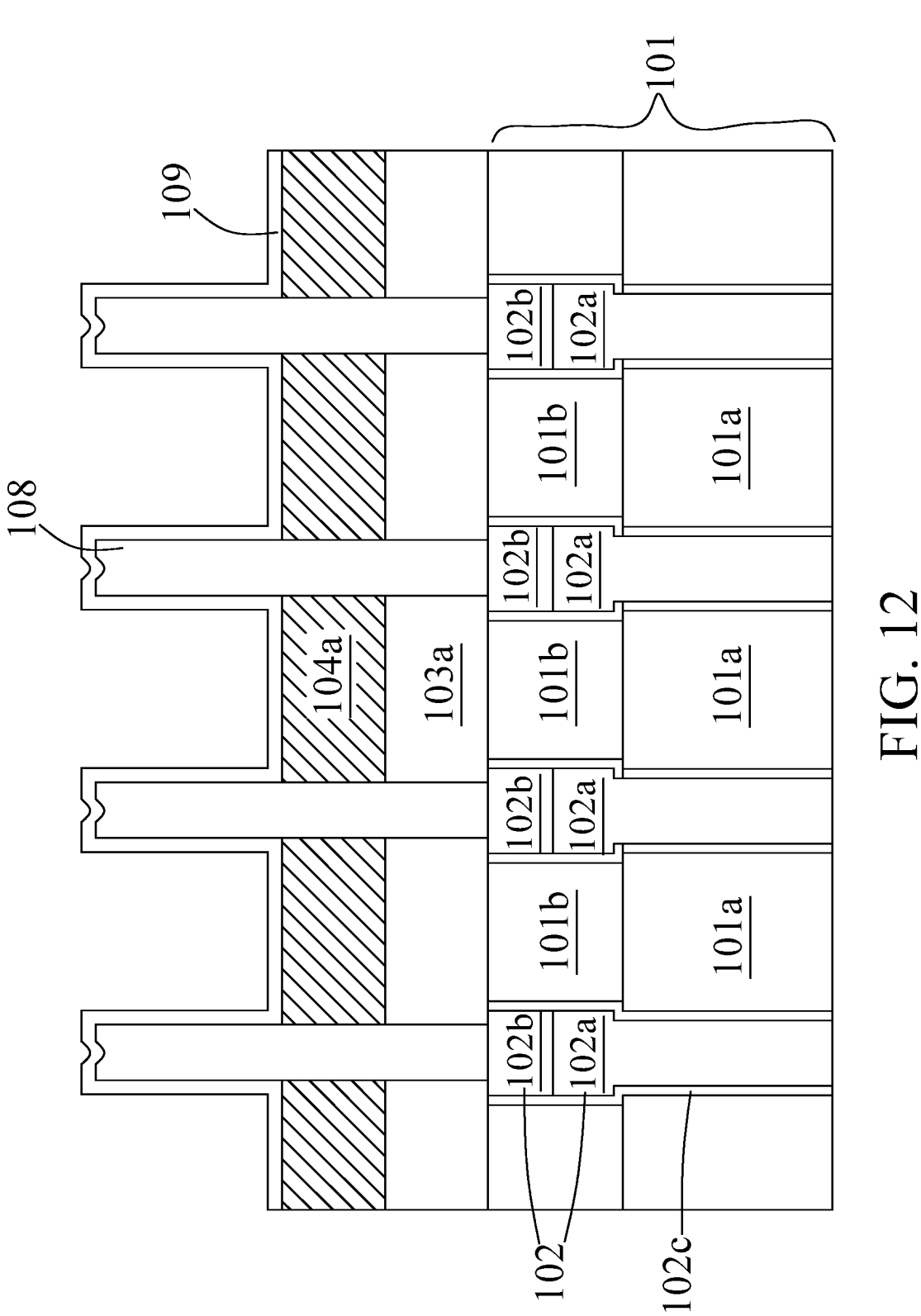
Figure 13:
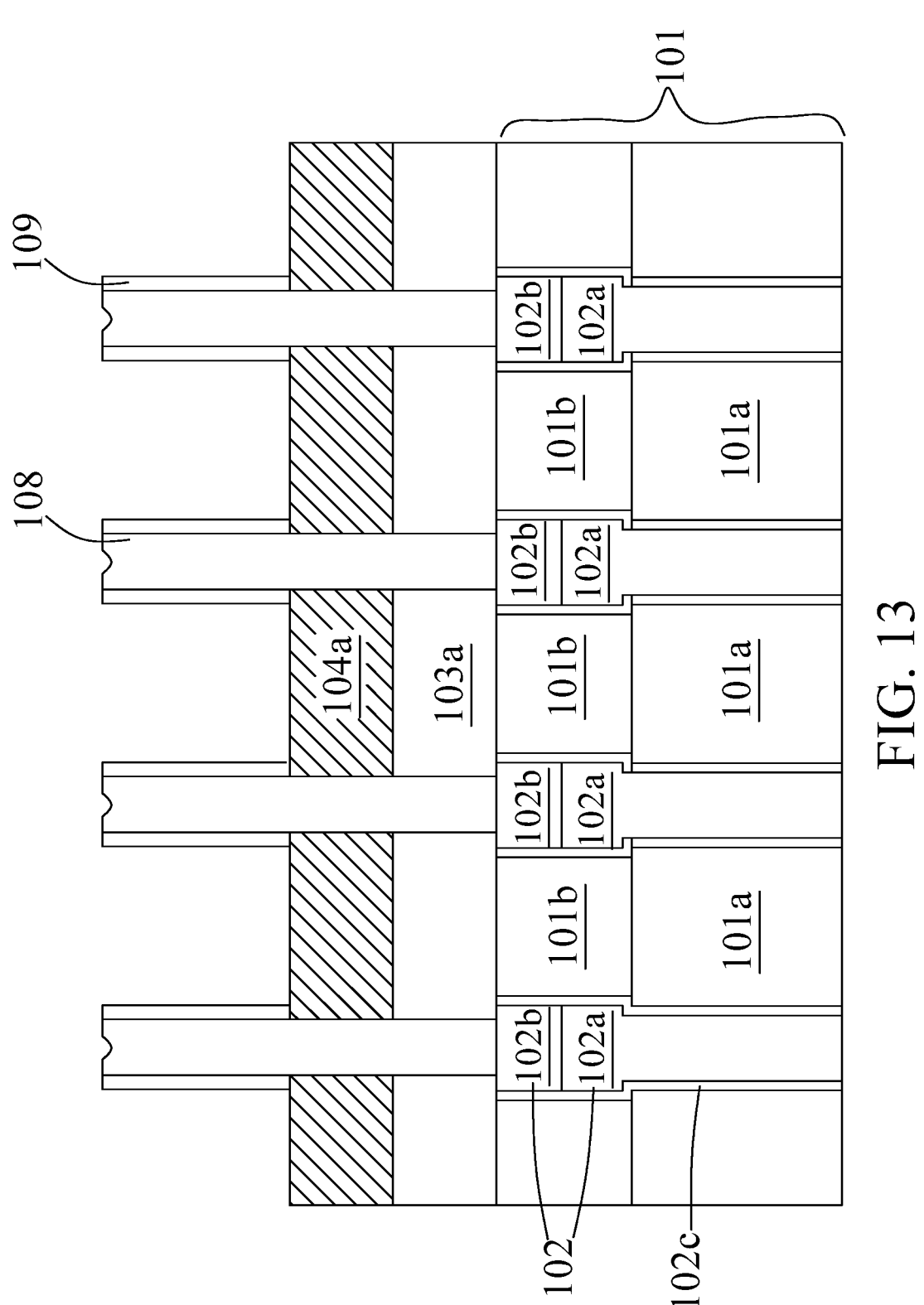

Referring to FIGS. 12 and 13, a third dielectric layer 109 conformal to the sacrificial material 108 exposed through the conductive layer 104a is disposed according to step S206 in FIG. 3. In some embodiments as shown in FIG. 12, the third dielectric layer 109 is disposed over the conductive layer 104a and the sacrificial material 108 protruding from the conductive layer 104a, and then some portions of the third dielectric layer 109 disposed over the conductive layer 104a and an upper end of the sacrificial material 108 are removed as shown in FIG. 13.

In some embodiments, the third dielectric layer 109 is disposed by deposition or any other suitable process. In some embodiments, the third dielectric layer 109 includes a material same as that of the first dielectric layer 103a. In some embodiments, the third dielectric layer 109 includes dielectric material such as oxide or the like. In some embodiments, the portions of the third dielectric layer 109 disposed over the conductive layer 104a and the upper end of the sacrificial material 108 are removed by etching or any other suitable process.

In some embodiments, a thickness of the third dielectric layer 109 is about 5 nm to about 8 nm. In some embodiments, the thickness of the third dielectric layer 109 is about 7 nm. In some embodiments, the upper end of the sacrificial material 108 is exposed through the third dielectric layer 109 as shown in FIG. 13. In some embodiments, the third dielectric layer 109 at least partially surrounds the sacrificial material 108.

Figure 14:
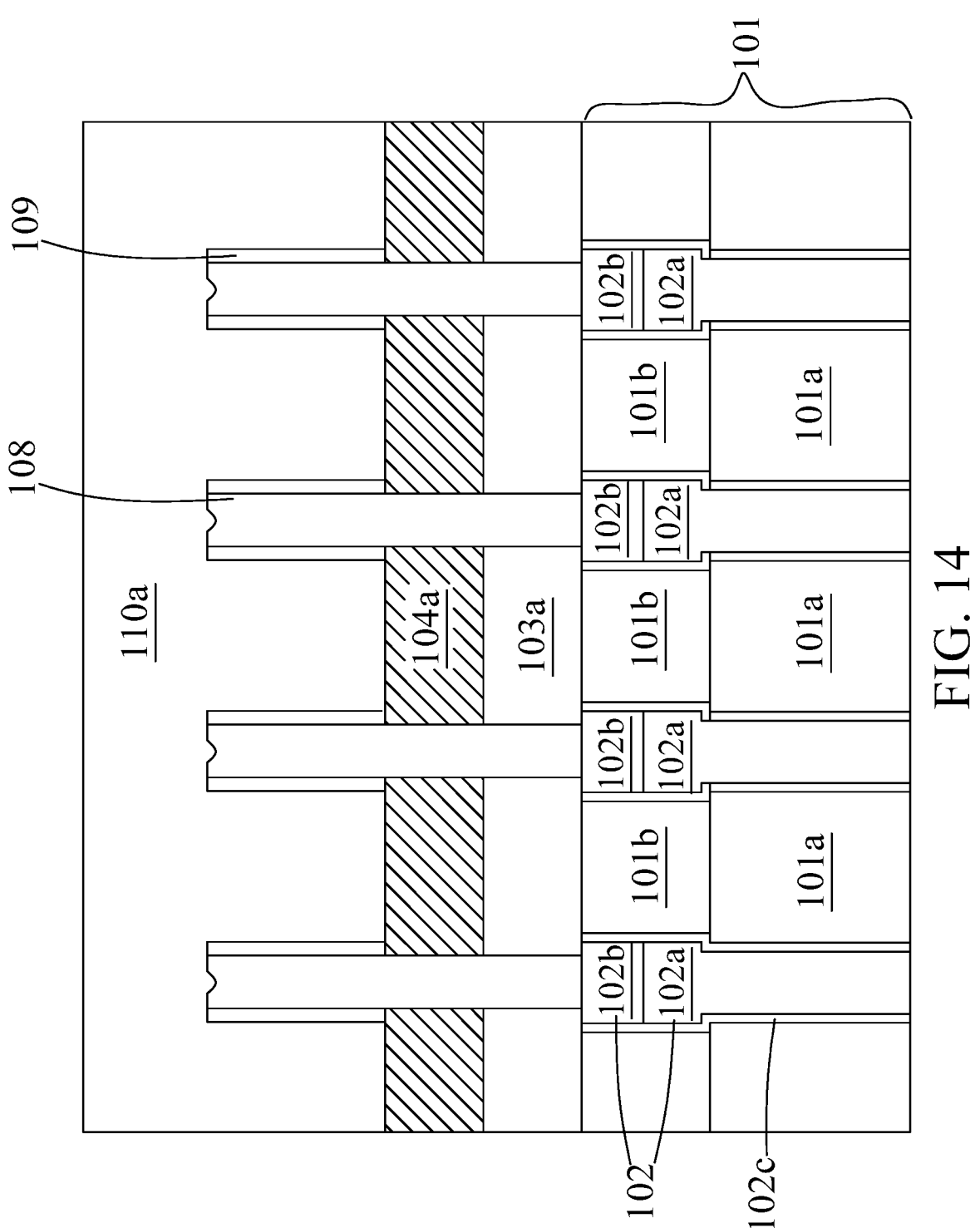
Figure 15:
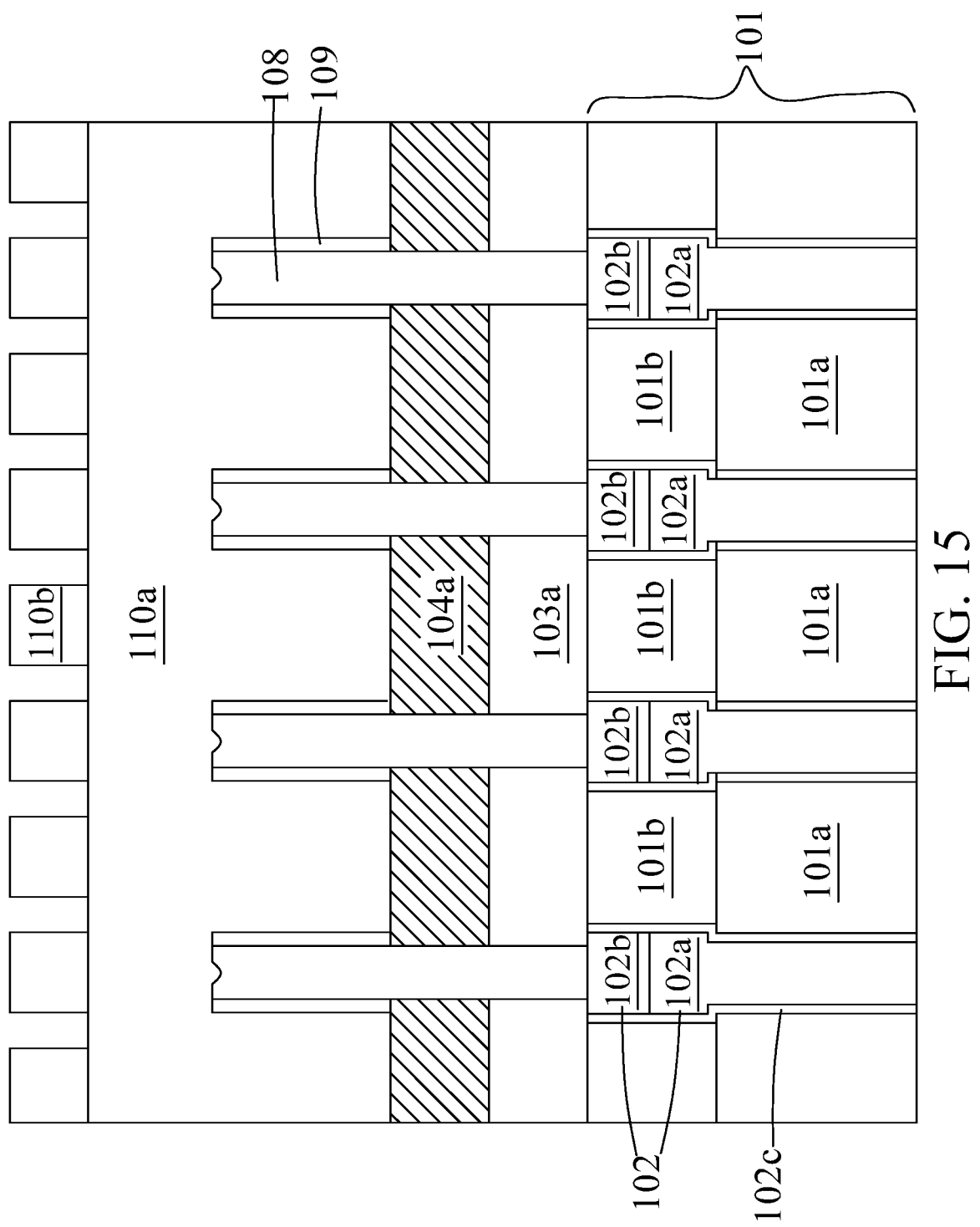
Figure 16:
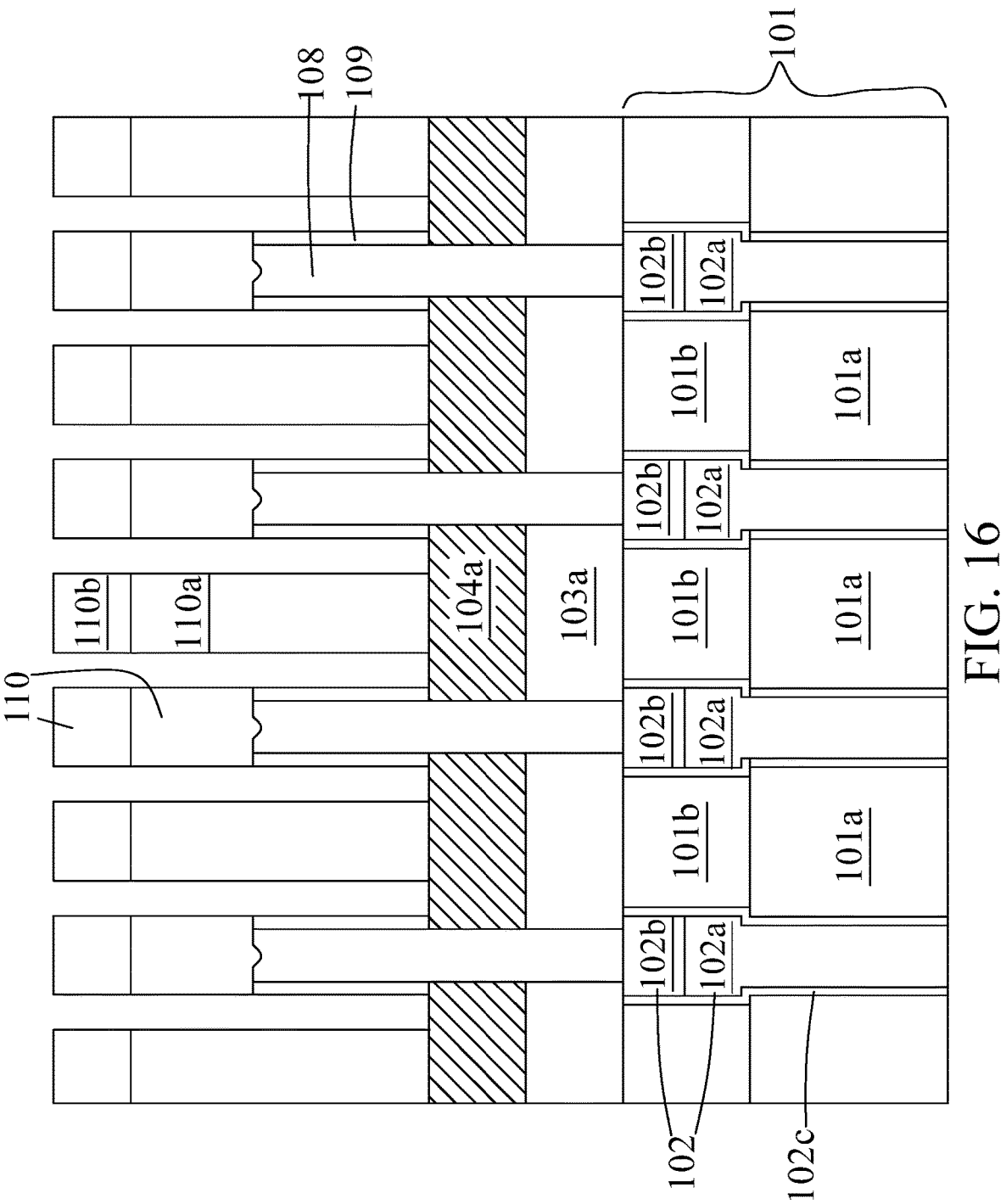

Referring to FIGS. 14 to 16, a patterned mask 110 is disposed over the conductive layer 104a, over the sacrificial material 108 exposed through the conductive layer 104a, and over the third dielectric layer 109 surrounding the sacrificial material 108 according to step S207 in FIG. 3. In some embodiments, the patterned mask 110 includes carbon or nitride.

In some embodiments, the patterned mask 110 is formed by disposing a carbon layer 110*a* over the third dielectric layer 109, the sacrificial material 108 and the conductive layer 104*a* as shown in FIG. 14, disposing a nitride layer 110*b* over the carbon layer 110*a*, removing some portions of the nitride layer 110*b* to pattern the nitride layer 110*b* as shown in FIG. 15, and removing portions of the carbon layer 110*a* exposed through the patterned nitride layer 110*b* as shown in FIG. 16. In some embodiments, the patterned mask 110 exposes at least a portion of the conductive layer 104*a*.

Figure 17:
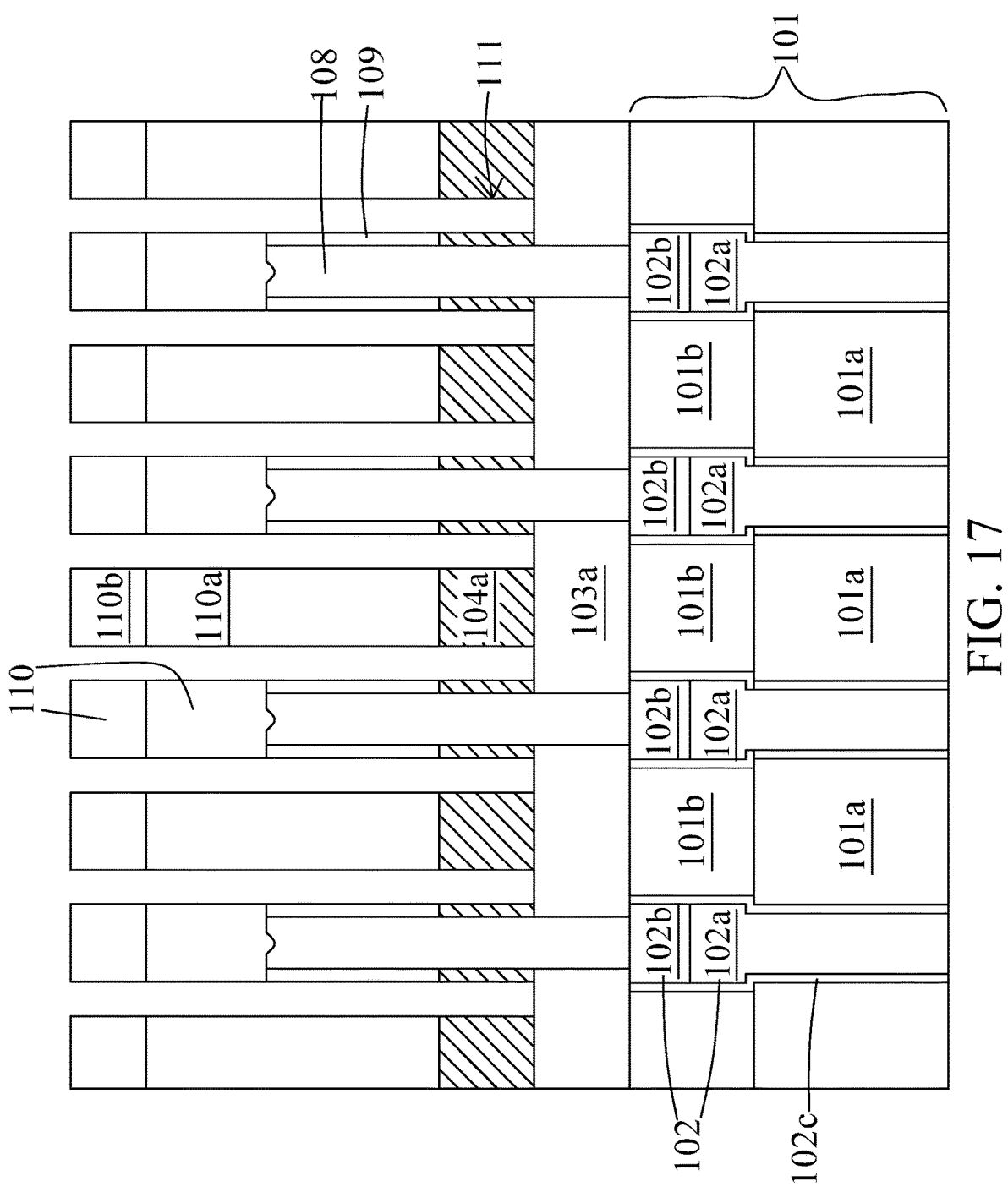
Figure 18:
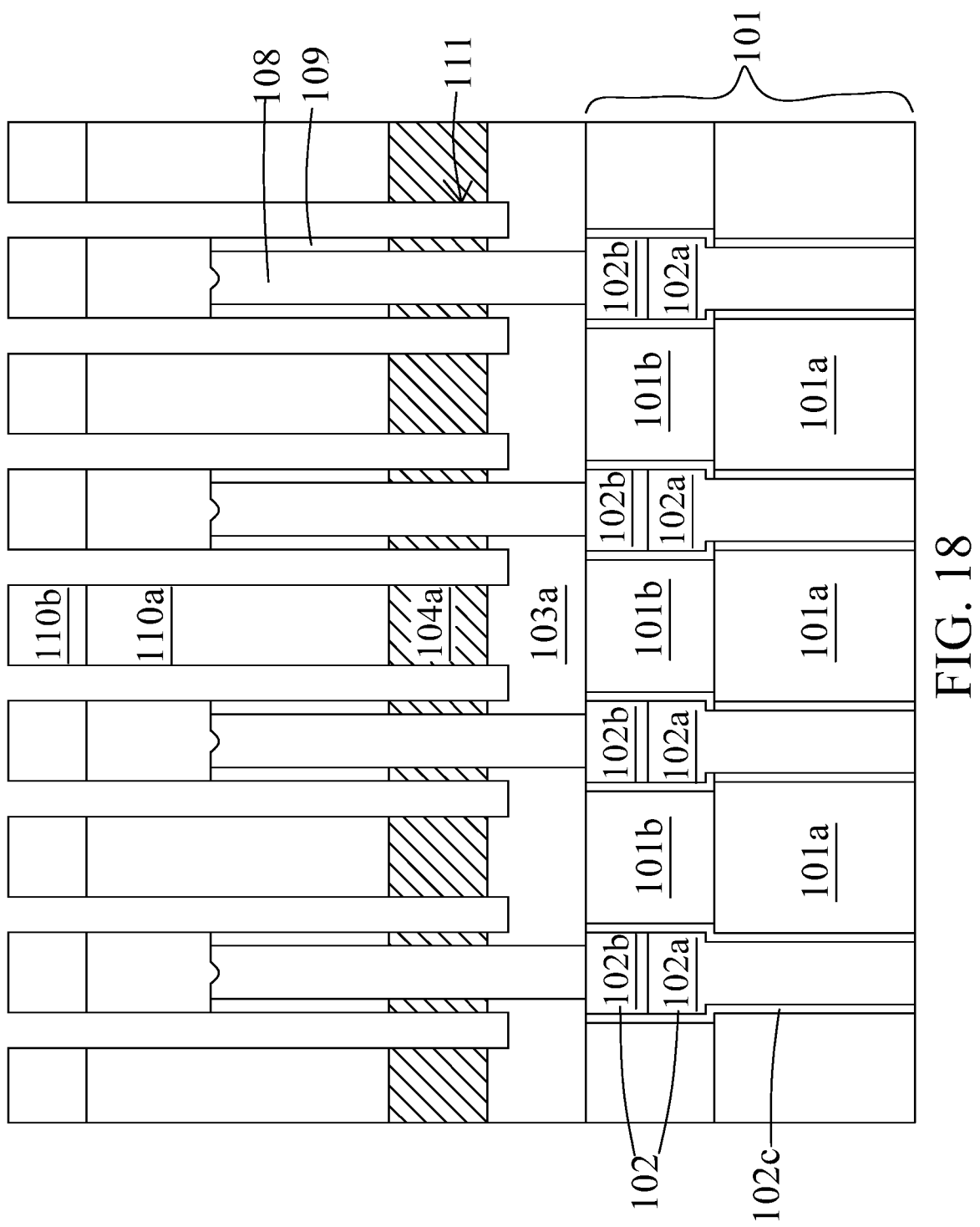

Referring to FIGS. 17 and 18, portions of the conductive layer 104*a* and the first dielectric layer 103*a* exposed through the patterned mask 110 are removed to form a second trench 111 according to step S208 in FIG. 3. In some embodiments, some portions of the conductive layer 104*a* exposed through the patterned mask 110 are removed as shown in FIG. 17, and then some portions of the first dielectric layer 103*a* exposed through the conductive layer 104*a* and the patterned mask 110 are removed as shown in FIG. 18. In some embodiments, the second trench 111 extending through the conductive layer 104*a* and partially through the first dielectric layer 103*a* is formed as shown in FIG. 18.

In some embodiments, the portions of the conductive layer 104*a* and the first dielectric layer 103*a* exposed through the patterned mask 110 are removed by dry etching or any other suitable process. In some embodiments, the removal of some portions of the conductive layer 104*a* exposed through the patterned mask 110 and the removal of some portions of the first dielectric layer 103*a* exposed through the conductive layer 104*a* and the patterned mask 110 are performed separately and sequentially. In some embodiments, after the formation of the second trench 111, at least a portion of the sacrificial material 108 is enclosed by the conductive layer 104*a*, and at least a portion of the sacrificial material 108 protrudes into the first dielectric layer 103*a*.

Figure 19:
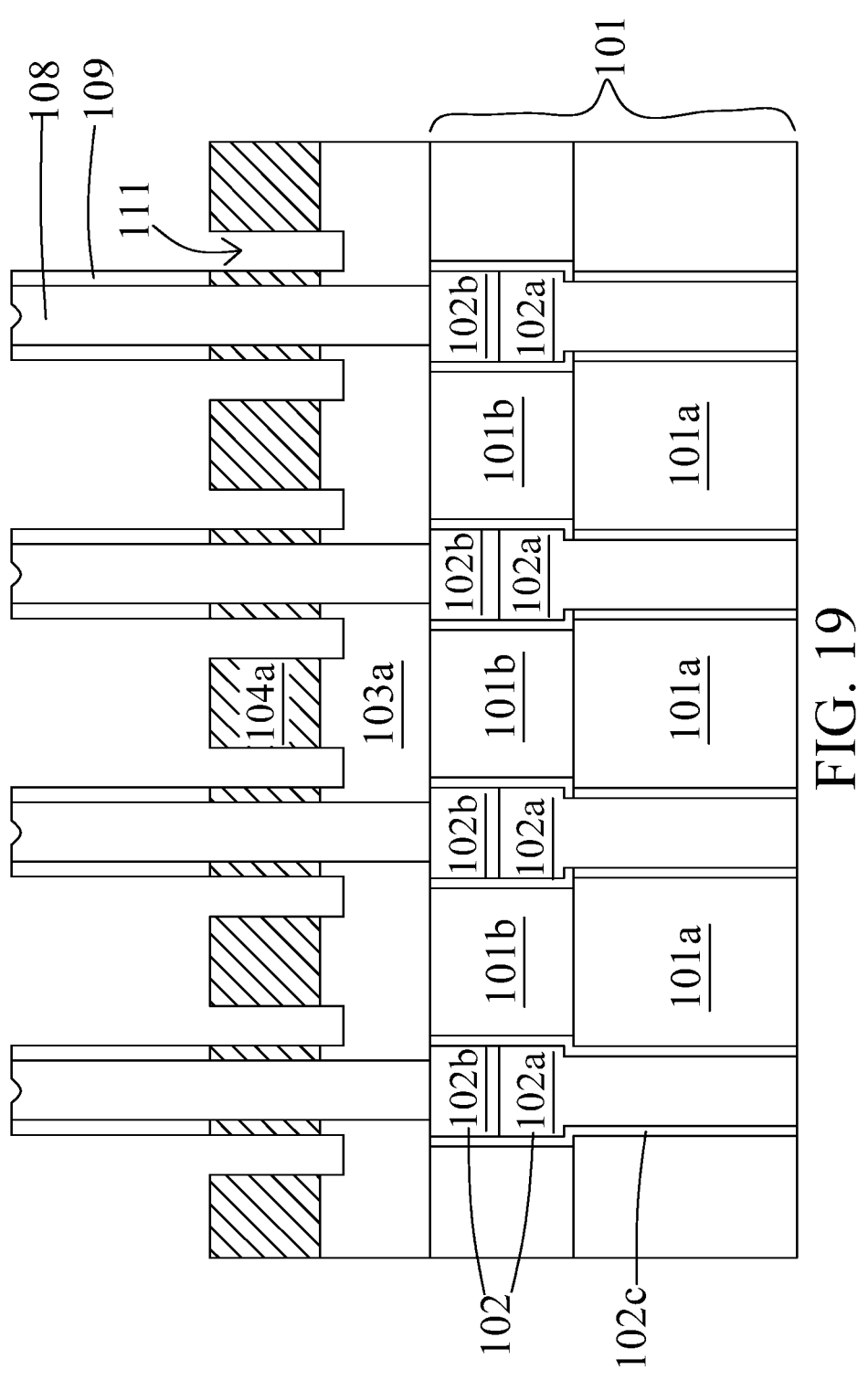

Referring to FIG. 19, the patterned mask 110 is removed according to step S209 in FIG. 3. In some embodiments, the patterned mask 110 is removed by etching, stripping or any other suitable process. In some embodiments, the removal of the patterned mask 110 includes removing the nitride layer 110*b* and then removing the carbon layer 110*a*. In some embodiments, at least a portion of the sacrificial material 108 is surrounded by the third dielectric layer 109 after the removal of the patterned mask 110.

Figure 20:
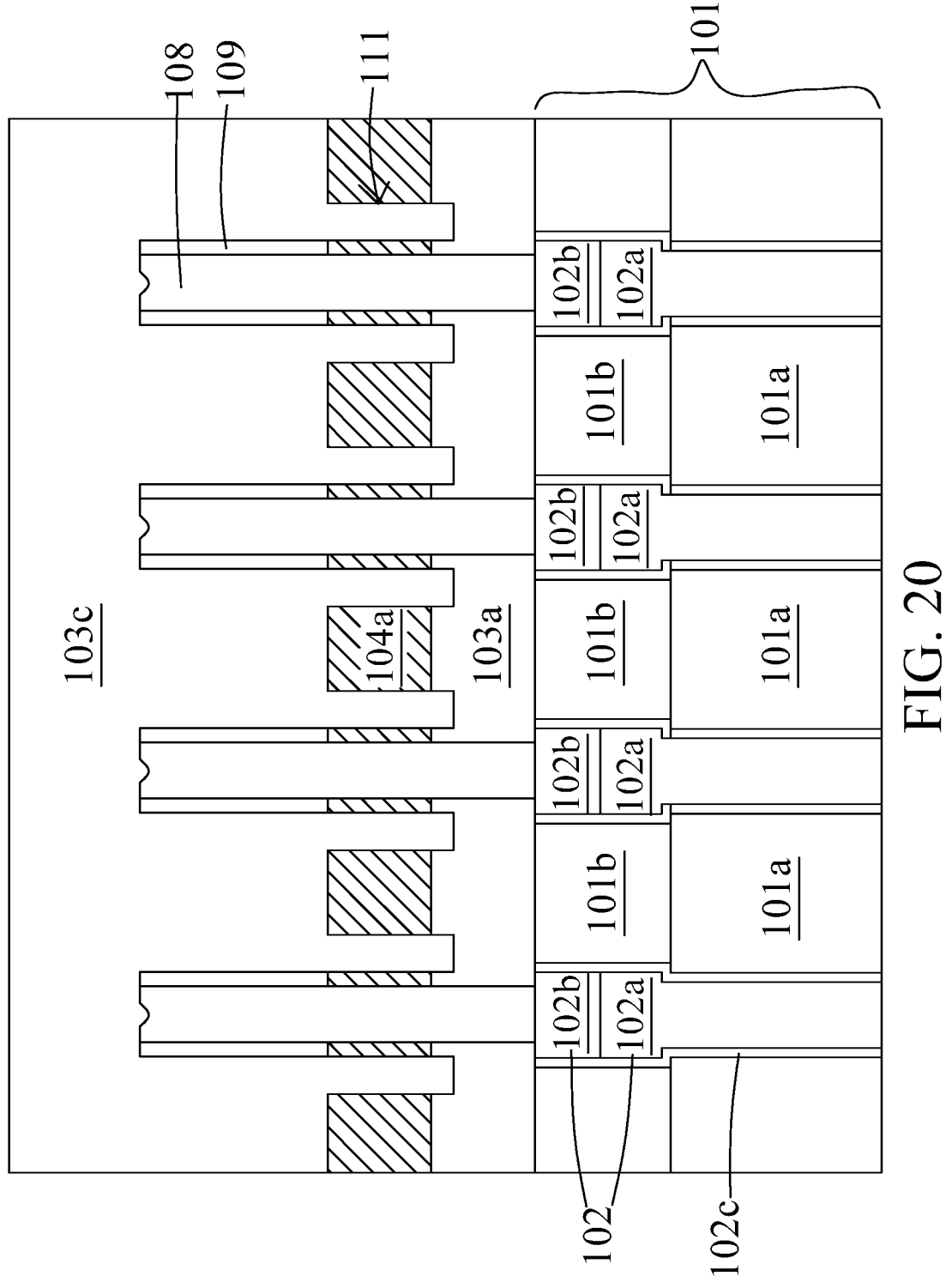
Figure 21:
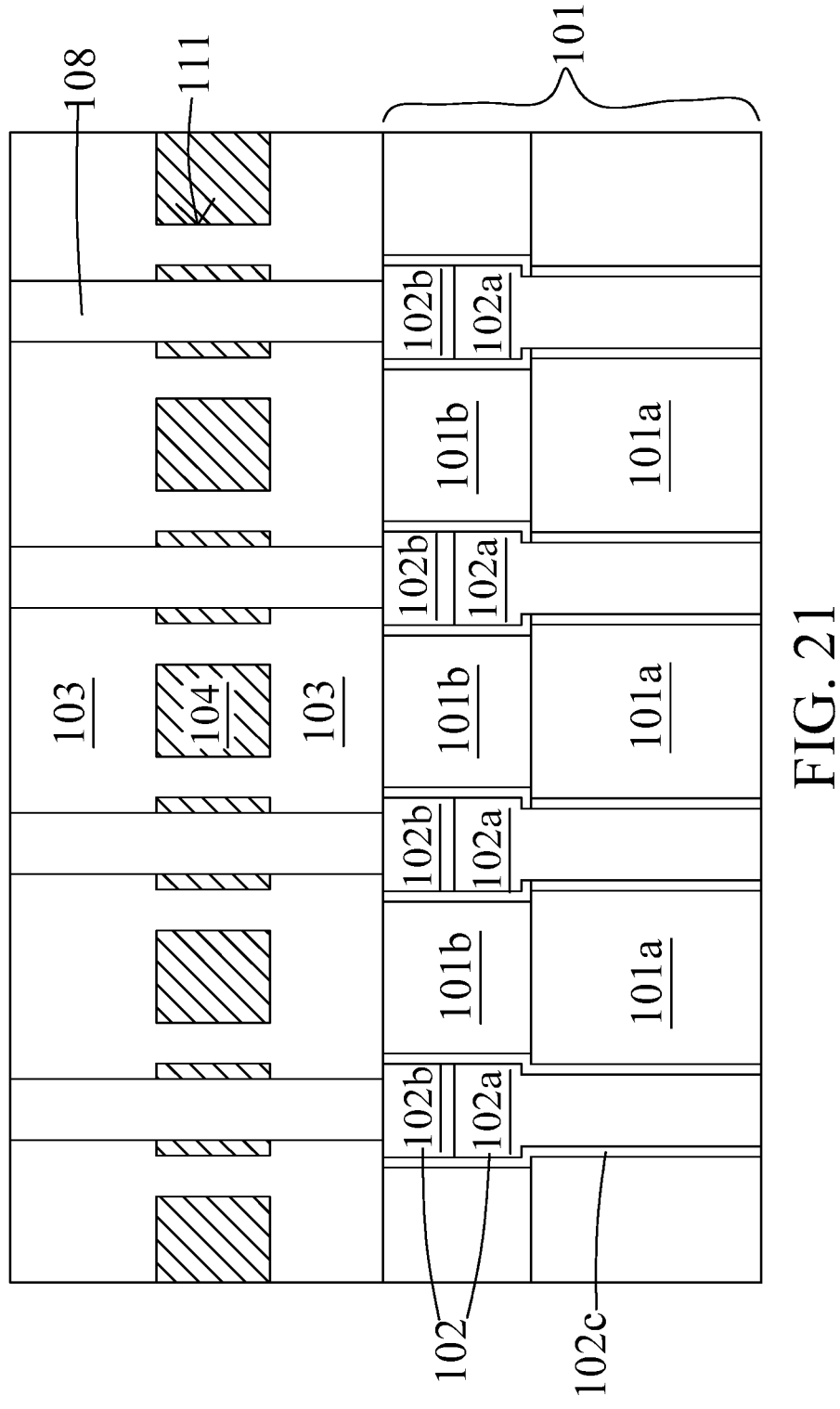

Referring to FIGS. 20 and 21, a fourth dielectric layer 103*c* is disposed within the second trench 111 according to step S210 in FIG. 3. In some embodiments, the fourth dielectric layer 103*c* is disposed within the second trench 111 and over the conductive layer 104*a* and surrounding the sacrificial material 108 and the third dielectric layer 109 as shown in FIG. 20, and then some portions of the fourth dielectric layer 103*c*, the sacrificial material 108 and the third dielectric layer 109 are removed as shown in FIG. 21.

In some embodiments, the disposing of the fourth dielectric layer 103*c* as shown in FIG. 20 includes disposing dielectric material such as oxide by deposition or any other suitable process. In some embodiments, at least a portion of the fourth dielectric layer 103*c* is surrounded by the first dielectric layer 103*a*. In some embodiments as shown in FIG. 20, a thickness of the fourth dielectric layer 103*c* is substantially greater than a thickness of the first dielectric layer 103*a*.

In some embodiments as shown in FIG. 21, some portions of the fourth dielectric layer 103*c*, the sacrificial material 108 and the third dielectric layer 109 are removed by chemical mechanical polishing (CMP), planarization or any other suitable process. In some embodiments, after the portions of the fourth dielectric layer 103*c*, the sacrificial material 108 and the third dielectric layer 109 are removed, the first dielectric layer 103*a*, the third dielectric layer 109 and the fourth dielectric layer 103*c* are integrated to become a second dielectric 103 as shown in FIG. 21. In some embodiments, the conductive layer 104*a* becomes a word line 104 as shown in FIG. 21. The word line 104 is at least partially exposed after the removal of the sacrificial material 108.

Figure 22:
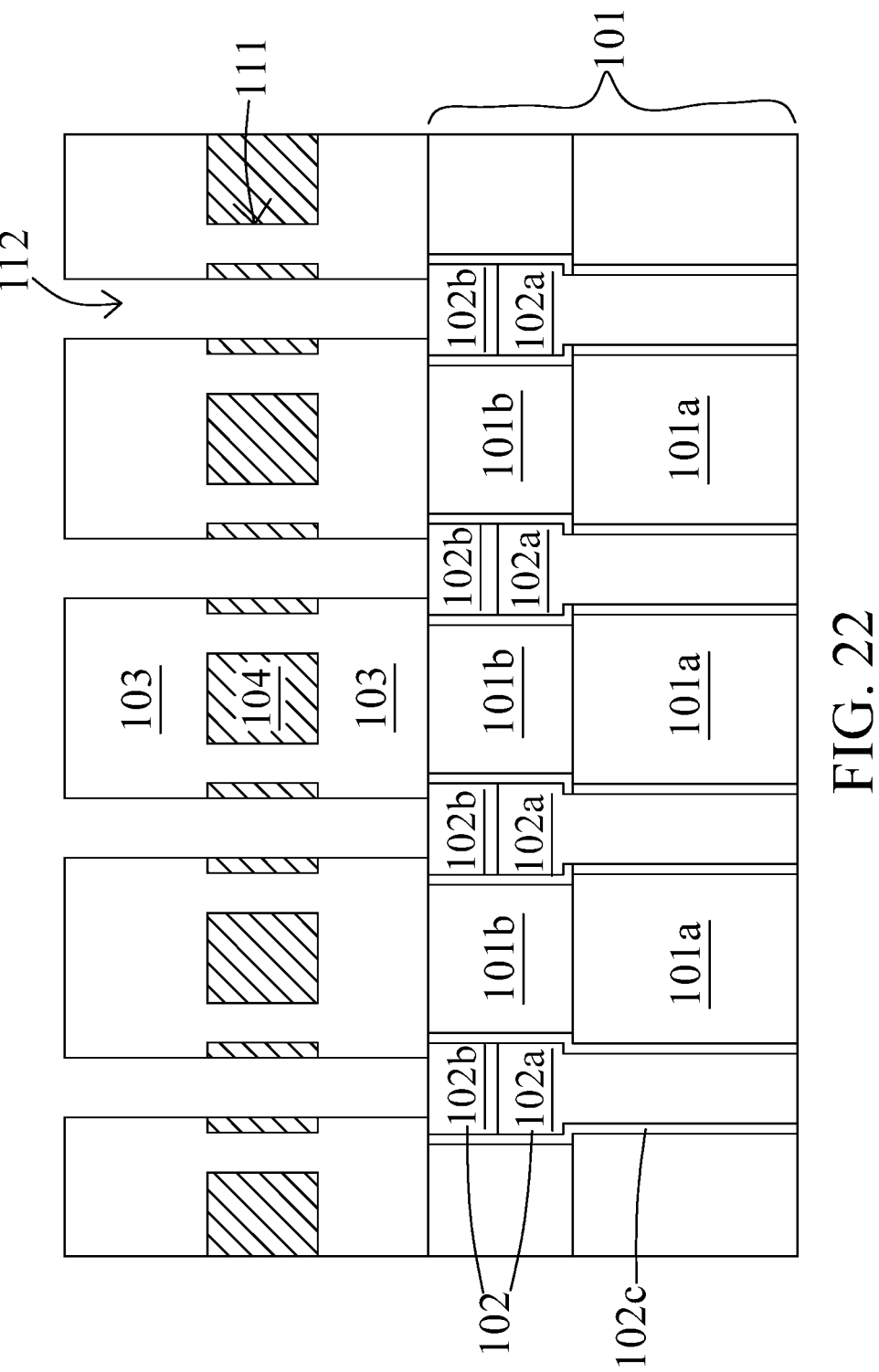

Referring to FIG. 22, the sacrificial material 108 is removed according to step S211 in FIG. 3. In some embodiments, the sacrificial material 108 is removed by wet etching or any other suitable process. In some embodiments, a third trench 112 extending through the second dielectric 103 and at least partially surrounded by the word line 104 is formed after the removal of the sacrificial material 108.

Figure 23:
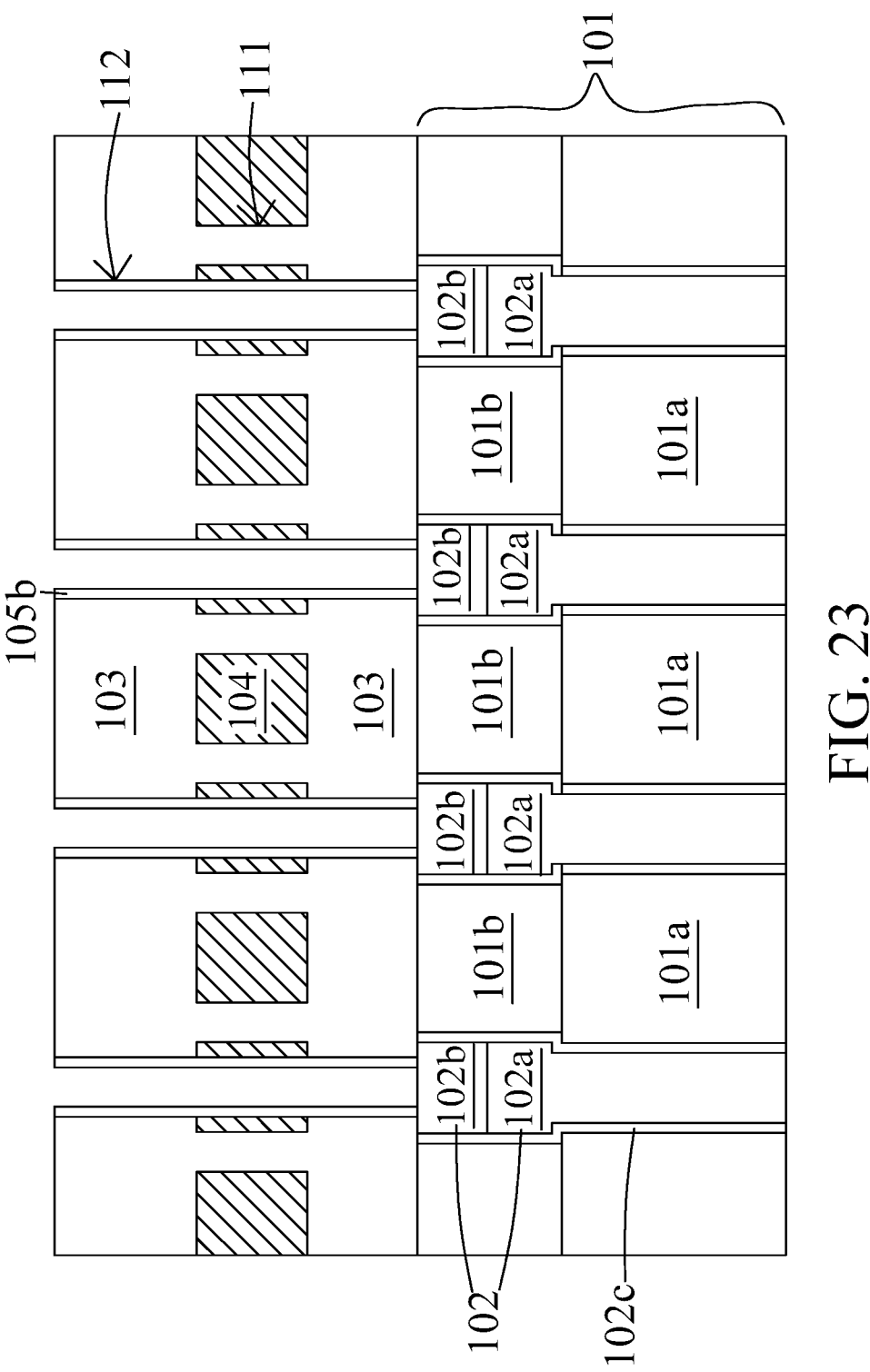
Figure 24:
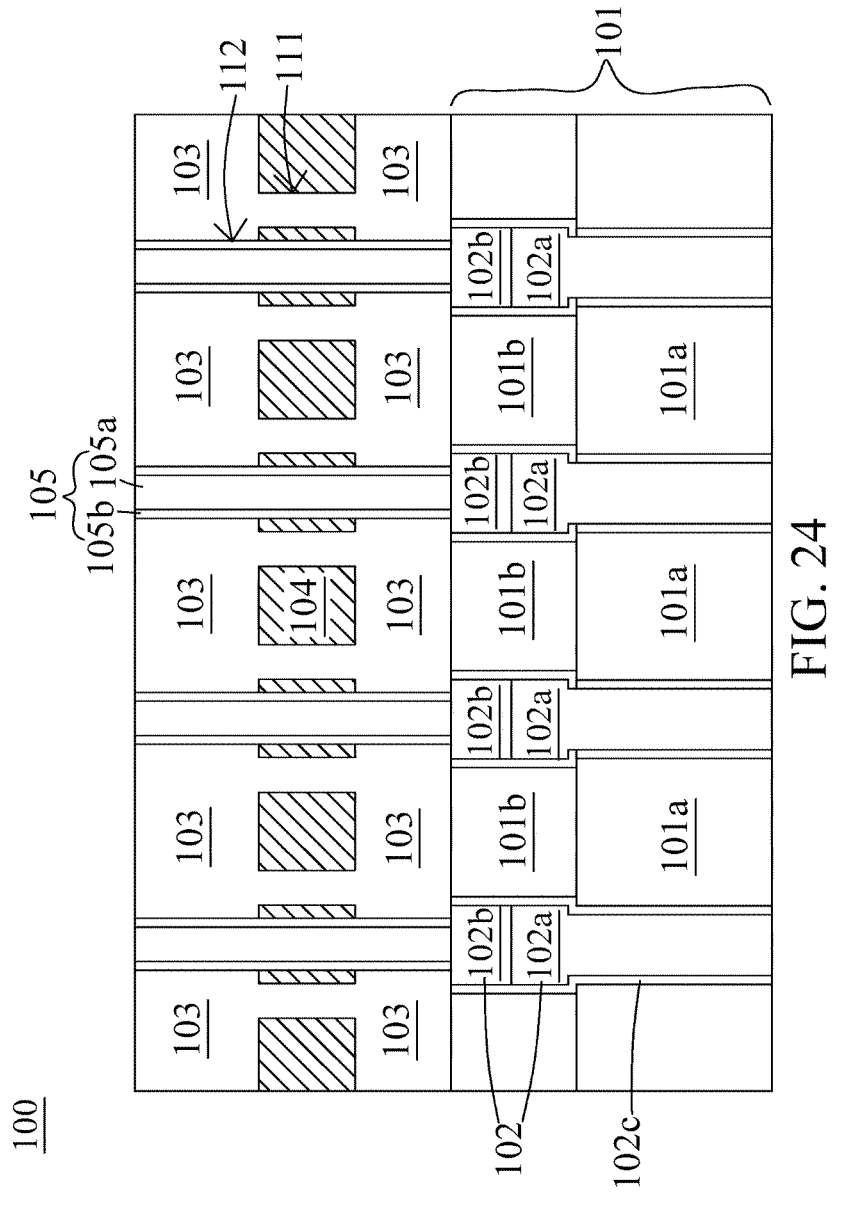

In some embodiments, after the removal of the sacrificial material 108 and the formation of the third trench 112, a gate structure 105 is formed within the third trench 112 as shown in FIGS. 23 and 24. In some embodiments, the formation of the gate structure 105 includes disposing a gate dielectric 105*b* conformal to the third trench 112 as shown in FIG. 23, and disposing a gate electrode 105*a* over the capacitor 102 as shown in FIG. 24.

In some embodiments as shown in FIG. 23, the gate dielectric 105*b* is disposed conformal to the third trench 112 and over the second conductive member 102*b* of the capacitor 102 by deposition or any other suitable process. In some embodiments, the gate dielectric 105*b* includes dielectric material such as silicon oxide or the like.

In some embodiments as shown in FIG. 24, the gate electrode 105*a* is disposed over the second conductive member 102*b* of the capacitor 102 and surrounded by the gate dielectric 105*b*. In some embodiments, the gate electrode 105*a* is formed by deposition or any other suitable process. In some embodiments, the gate electrode 105*a* includes conductive material such as indium gallium zinc oxide (IGZO) or the like.

In some embodiments, the gate structure 105 is at least partially surrounded by the word line 104. In some embodiments, the gate electrode 105*a* is surrounded by the gate dielectric 105*b*. In some embodiments, the memory device 100 of FIG. 1 is formed as shown in FIG. 24.

In an aspect of the present disclosure, a memory device is provided. The memory device includes a first dielectric surrounding a capacitor; a second dielectric disposed over the first dielectric and the capacitor; a word line embedded in the second dielectric; and a gate structure disposed over the capacitor and extending through the second dielectric, wherein the gate structure is at least partially surrounded by the word line.

In another aspect of the present disclosure, a memory device is provided. The memory device includes a first dielectric surrounding a capacitor; a second dielectric disposed over the first dielectric and the capacitor; a word line embedded in the second dielectric; and a gate structure disposed over the capacitor and surrounded by the second dielectric and the word line, wherein at least a portion of the gate structure is enclosed by the word line.

In another aspect of the present disclosure, a method of manufacturing a memory device is provided. The method includes steps of providing a first dielectric and a capacitor surrounded by the first dielectric; disposing a first dielectric layer, a conductive layer and a second dielectric layer sequentially over the first dielectric and the capacitor; forming a first trench extending through the second dielectric layer, the conductive layer and the first dielectric layer; disposing a sacrificial material within the first trench; removing the second dielectric layer; disposing a third dielectric layer conformal to the sacrificial material exposed through the conductive layer; disposing a patterned mask over the conductive layer, over the sacrificial material exposed through the conductive layer, and over the third dielectric layer surrounding the sacrificial material; removing portions of the conductive layer and the first dielectric layer exposed through the patterned mask to form a second trench; removing the patterned mask; disposing a fourth dielectric layer within the second trench; and removing the sacrificial material.

In conclusion, because a sacrificial material is disposed at a position of a gate structure to be subsequently formed, such advance position definition can prevent overlay shift of the gate structure. More specifically, because the sacrificial material is subsequently replaced by the gate structure, the gate structure surrounded by a word line can be readily formed, and such replacement can prevent incomplete enclosure of the gate structure by the word line. Therefore, performance of the memory device and a process of manufacturing the memory device are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory device, comprising:
a first dielectric surrounding a capacitor;
a second dielectric disposed over the first dielectric and the capacitor;
a word line embedded in the second dielectric; and
a gate structure disposed over the capacitor and extending through the second dielectric,
wherein the gate structure is at least partially surrounded by the word line;
wherein a width of the capacitor is greater than a width of the gate structure;
wherein a thickness of the first dielectric is substantially greater than a thickness of the second dielectric;
wherein the thickness of the second dielectric is in a range of 90 nm to 110 nm.

2. The memory device according to claim 1, wherein a portion of the second dielectric extends through and is surrounded by the word line, wherein a width of the word line is less than the width of the capacitor.

3. The memory device according to claim 2, wherein the portion of the second dielectric is separated from the gate structure.

4. The memory device according to claim 2, wherein a shortest distance between the gate structure and the portion of the second dielectric is in a range of 3 nm to 8 nm.

5. The memory device according to claim 1, wherein the word line includes tungsten (W).

6. The memory device according to claim 1, wherein the gate structure includes a gate dielectric and a gate electrode surrounded by the gate dielectric.

7. The memory device according to claim 6, wherein the gate electrode is electrically connected to the capacitor.

8. The memory device according to claim 6, wherein the word line is in contact with the gate dielectric.

9. The memory device according to claim 6, wherein the gate dielectric includes silicon oxide and the gate electrode includes indium gallium zinc oxide (IGZO).

10. The memory device according to claim 1, wherein the capacitor includes a first conductive member and a second conductive member disposed over the first conductive member, wherein a width of the second conductive member is greater than the width of the gate structure.

11. The memory device according to claim 10, wherein the second conductive member is in contact with the gate structure.

12. The memory device according to claim 10, wherein the first conductive member includes silicon, and the second conductive member includes indium tin oxide (ITO).

13. The memory device according to claim 1, wherein a width of the gate structure is in a range of 20 nm to 30 nm.

* * * * *